(12) United States Patent
Hosono et al.

(10) Patent No.: US 7,839,679 B2
(45) Date of Patent: Nov. 23, 2010

(54) NONVOLATILE SEMICONDUCTOR MEMORY

(75) Inventors: Koji Hosono, Fujisawa (JP); Masahiro Yoshihara, Yokohama (JP); Dai Nakamura, Kawasaki (JP); Youichi Kai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/043,510

(22) Filed: Mar. 6, 2008

(65) Prior Publication Data

US 2008/0225591 A1 Sep. 18, 2008

(30) Foreign Application Priority Data

Mar. 13, 2007 (JP) ............................. 2007-063730

(51) Int. Cl.
*G11C 16/06* (2006.01)
*G11C 5/14* (2006.01)

(52) U.S. Cl. ............................. 365/185.05; 365/185.17; 365/185.18; 365/154; 365/226; 716/8; 716/19

(58) Field of Classification Search ........................ None
See application file for complete search history.

(56) References Cited

U.S. PATENT DOCUMENTS

| | | | | |
|---|---|---|---|---|
| 5,625,590 | A | * | 4/1997 | Choi et al. ............. 365/185.17 |
| 7,000,207 | B2 | * | 2/2006 | Gothoskar et al. ............. 716/8 |
| 7,031,179 | B2 | | 4/2006 | Yon et al. |
| 2006/0056229 | A1 | * | 3/2006 | Maeda et al. ............... 365/154 |
| 2006/0198196 | A1 | | 9/2006 | Abe et al. |

* cited by examiner

*Primary Examiner*—Hoai V Ho
*Assistant Examiner*—James G Norman
(74) *Attorney, Agent, or Firm*—Oblon, Spivak, McClelland, Maier & Neustadt, L.L.P.

(57) ABSTRACT

A nonvolatile semiconductor memory according to an aspect of the invention includes memory cell arrays including plural cell units, a power supply pad disposed on one end in a first direction of the memory cell arrays, and page buffers disposed in the first direction of the memory cell arrays. The nonvolatile semiconductor memory also includes plural bit lines which are disposed on the memory cell arrays while extending in the first direction and a first power supply line which is disposed on the plural bit lines on the memory cell arrays to connect the power supply pad and the page buffers.

20 Claims, 25 Drawing Sheets

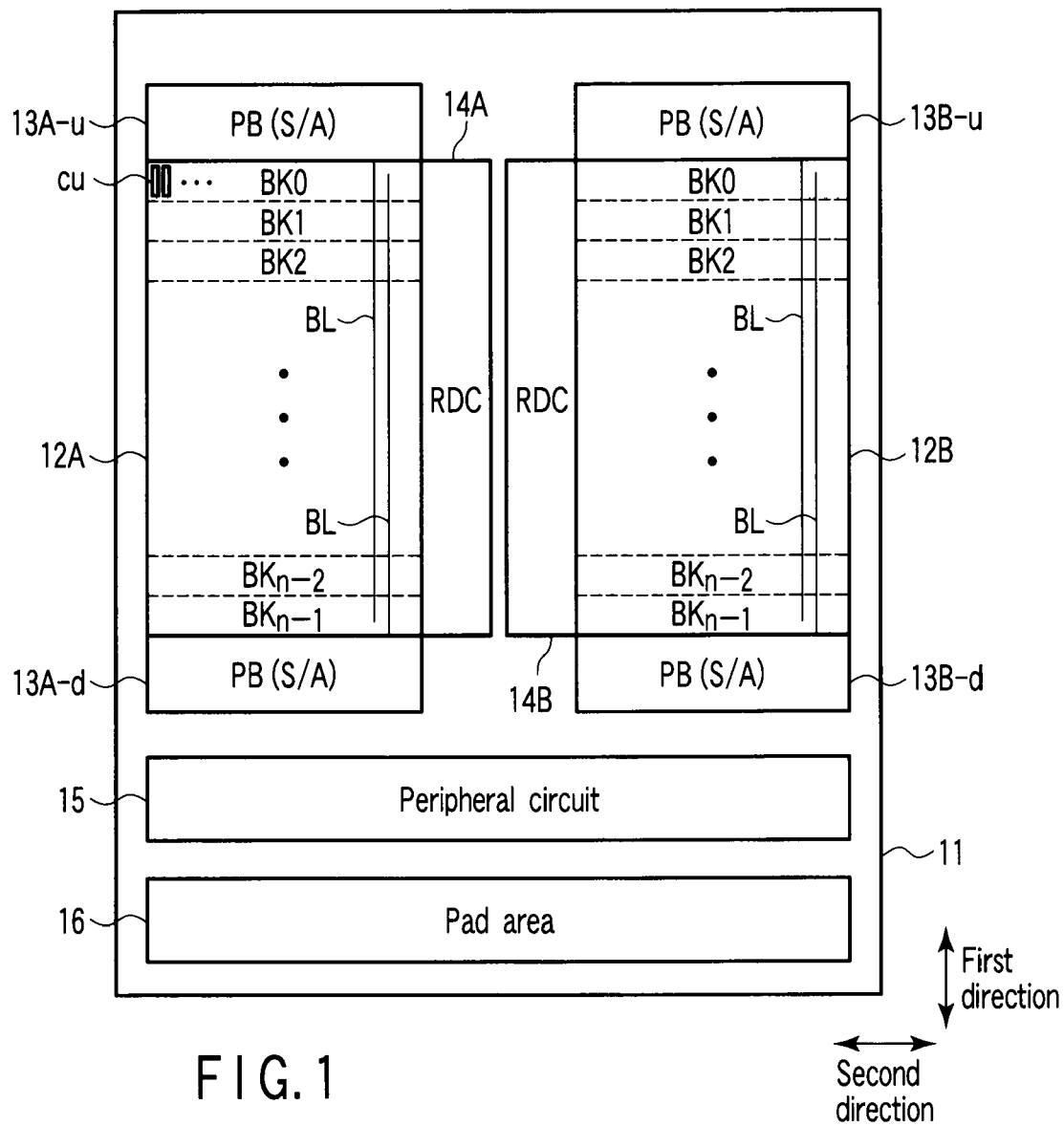
F I G. 1
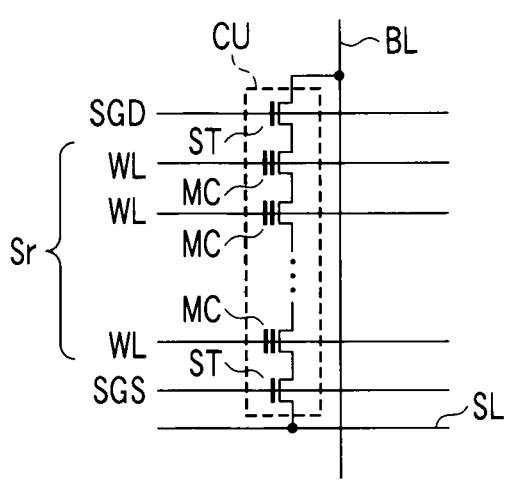
F I G. 2

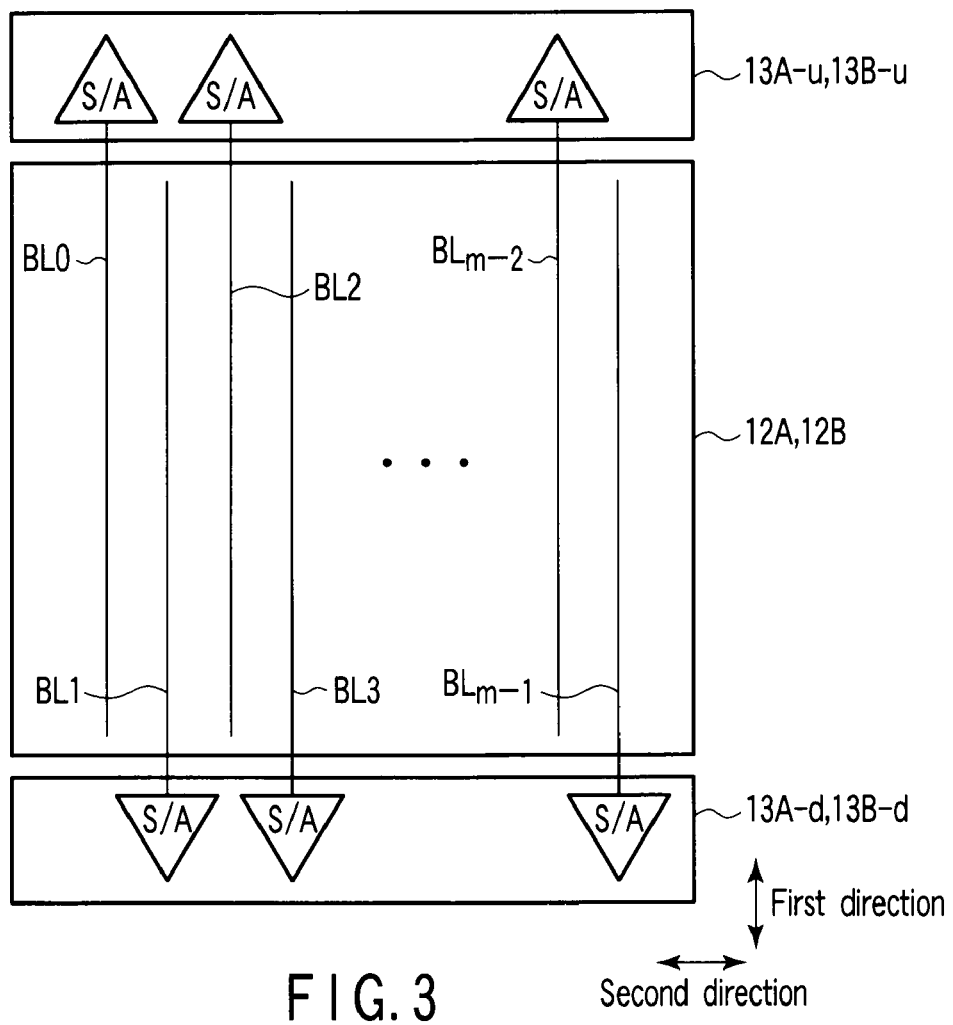
F I G. 3
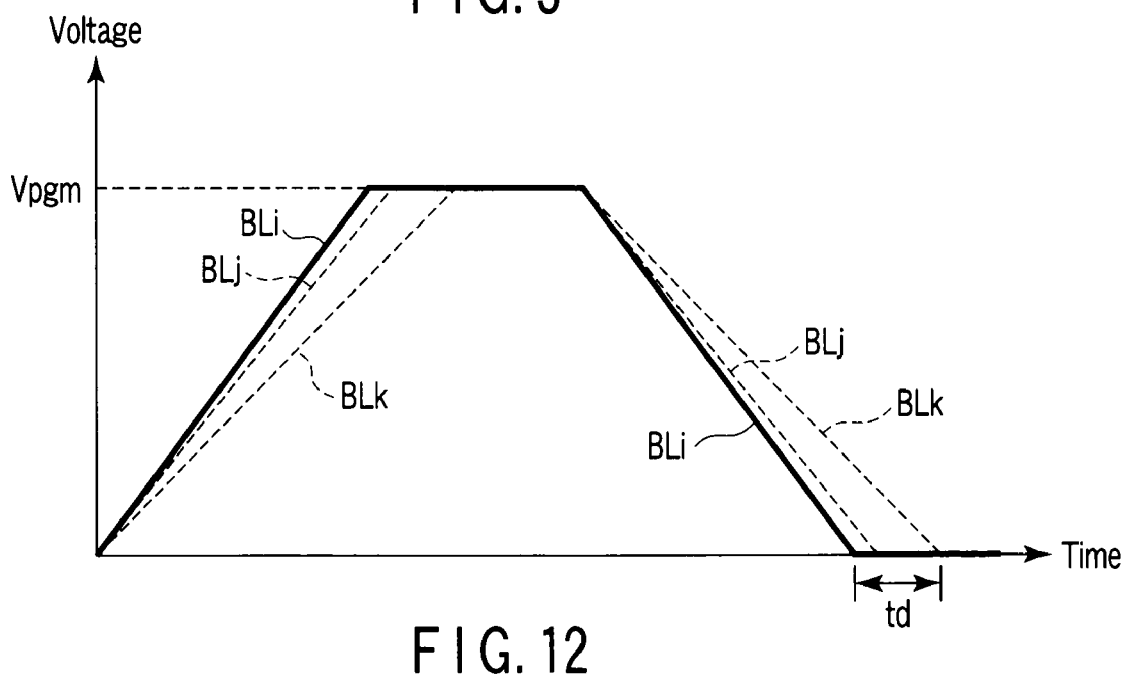
F I G. 12

Arrow: Route of power supply potential Vdd, Vss

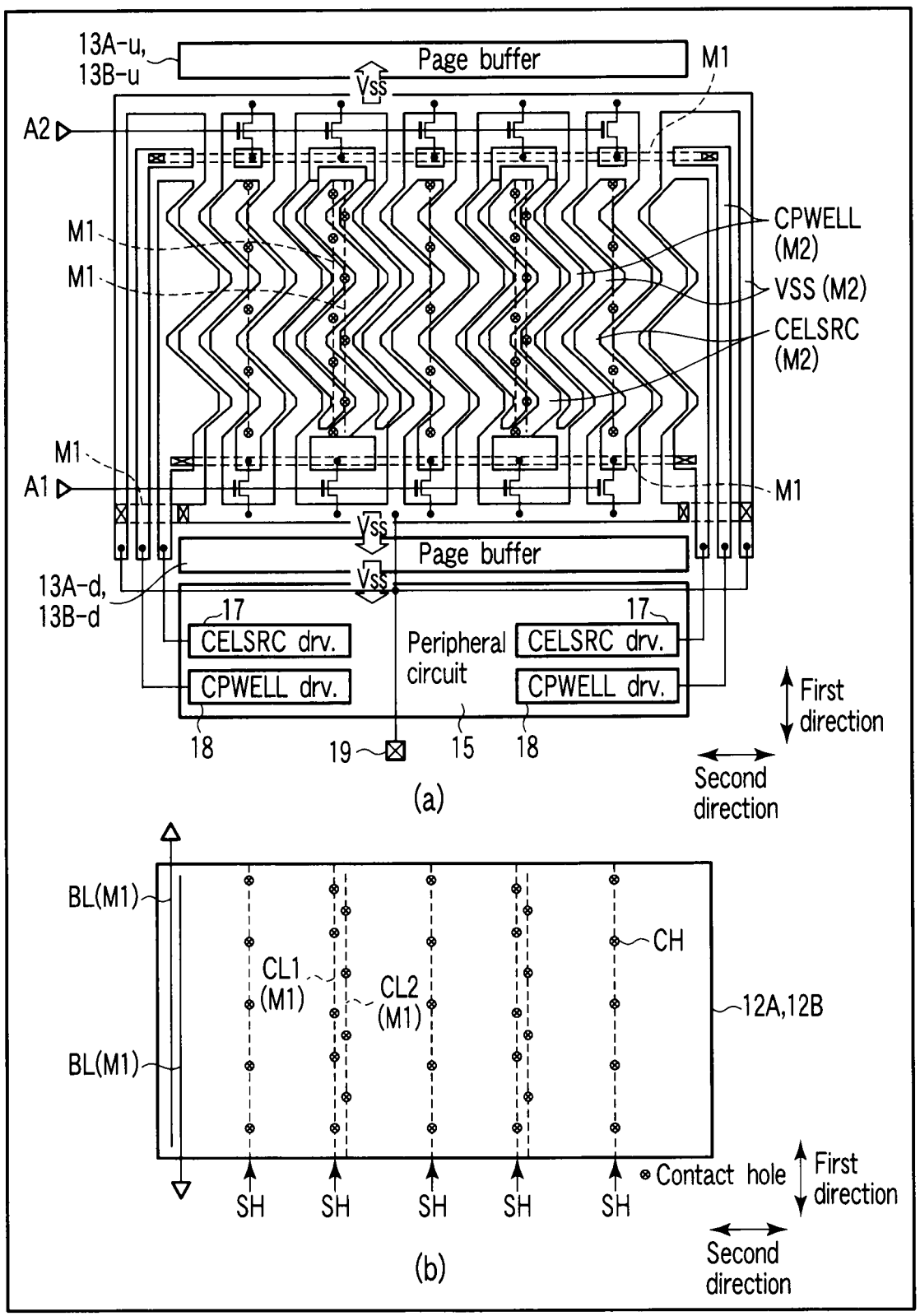
F I G. 16

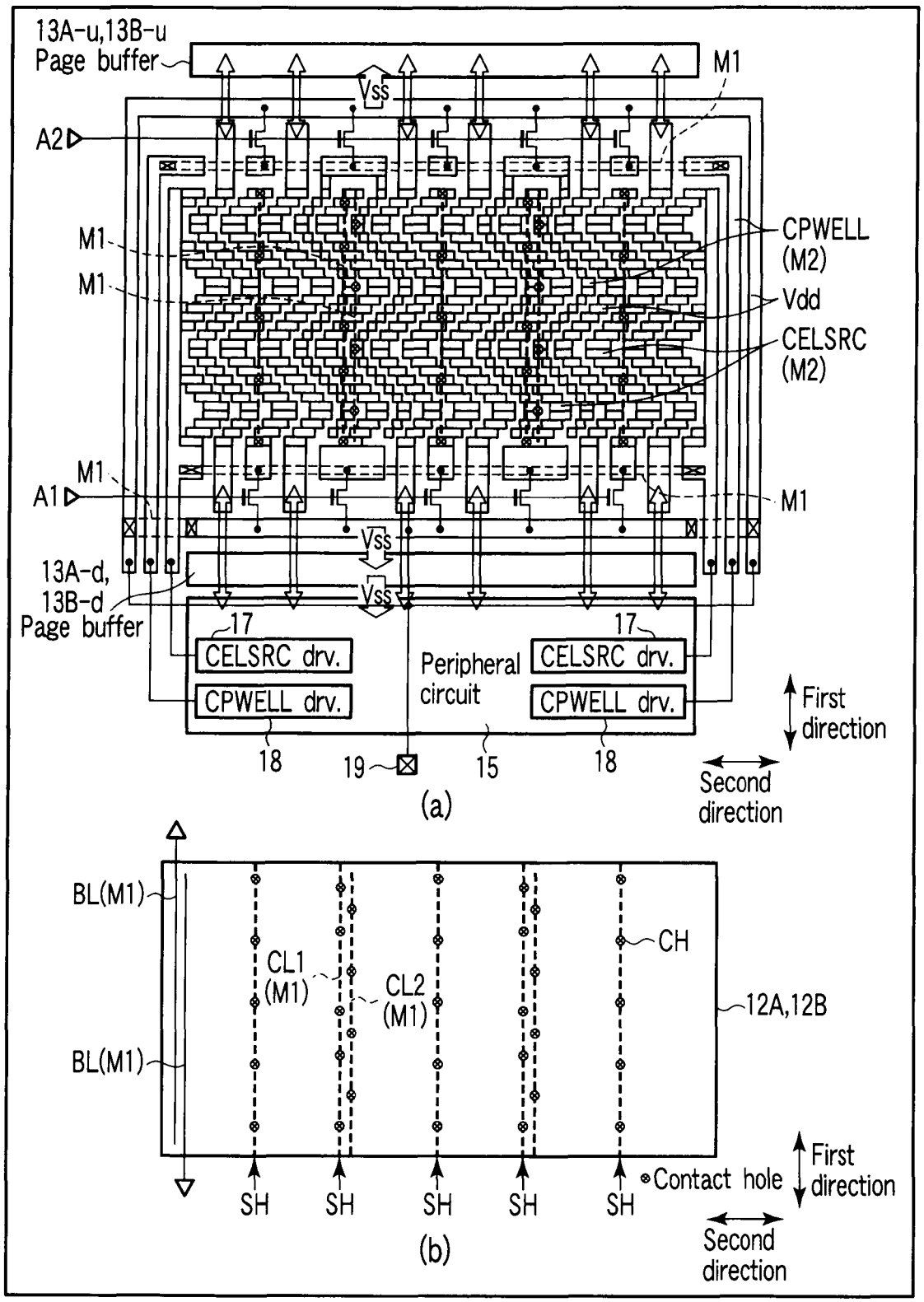
F I G. 20

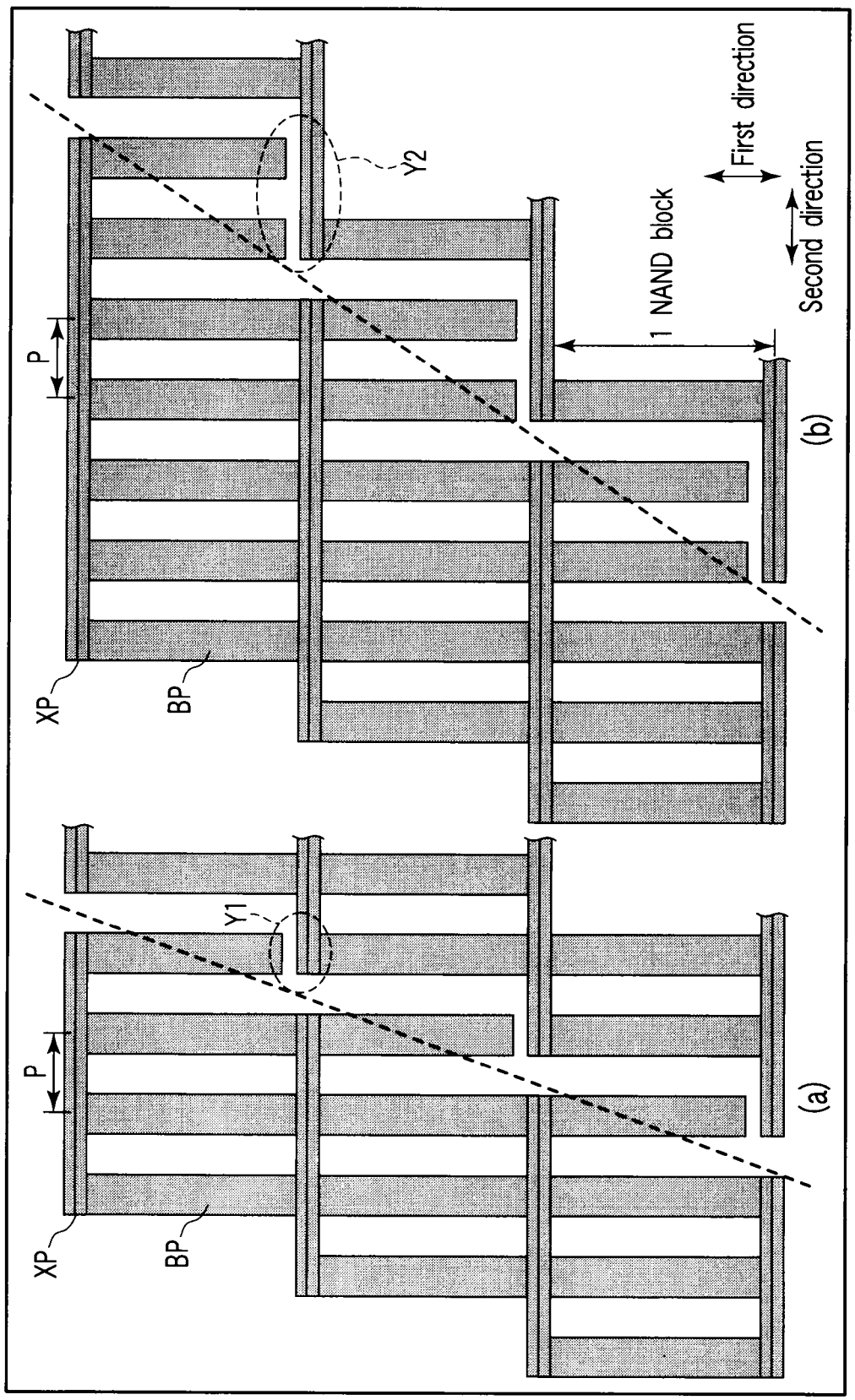
F I G. 30

NONVOLATILE SEMICONDUCTOR MEMORY

CROSS-REFERENCE TO RELATED APPLICATIONS

This application is based upon and claims the benefit of priority from prior Japanese Patent Application No. 2007-063730, filed Mar. 13, 2007, the entire contents of which are incorporated herein by reference.

BACKGROUND OF THE INVENTION

1. Field of the Invention

The present invention relates to interconnection layout of a nonvolatile semiconductor memory.

2. Description of the Related Art

Recently, a nonvolatile semiconductor memory, particularly a NAND flash memory is used in various electronic devices while exploiting large-capacity and nonvolatile characteristics.

In the case of the NAND flash memory, a cell unit includes plural memory cells connected in series and two select gate transistors connected on both ends of the plural memory cells. The cell unit is called NAND string.

When downsizing is performed in the memory cell and gate select transistor with increasing capacity, a resistance of a conductive line becomes troublesome unless means for using the conductive line disposed on a memory cell array and a method of connecting the conductive lines are properly devised.

For example, for a cell source line connected to a source diffusion layer on one end of the cell unit, and for a cell well line connected to a cell well area where the memory cell and the select gate transistor are arranged, it is necessary that the resistance of the cell source line and the cell well line be lowered as much as possible to stabilize potentials of the source diffusion layer and cell well area.

U.S. 2006/0198196 (Sep. 7, 2006) discloses a technique in which one (uppermost layer) of plural metal layers disposed on the memory cell array is maximally utilized for the cell source line and cell well line to lower the resistance of the conductive lines.

BRIEF SUMMARY OF THE INVENTION

A nonvolatile semiconductor memory according to an aspect of the present invention comprises a memory cell array includes a plurality of cell units, a power supply pad which is disposed on one end in a first direction of the memory cell array, a first page buffer which is disposed on the other end in the first direction of the memory cell array, a plurality of bit lines which are disposed on the memory cell array while extending in the first direction, and a first power supply line which is disposed on the plurality of bit lines on the memory cell array to connect the power supply pad and the first page buffer.

BRIEF DESCRIPTION OF THE SEVERAL VIEWS OF THE DRAWING

FIG. 1 shows an example of chip layout to which an example of the invention is applied;
FIG. 2 shows a NAND cell unit;
FIG. 3 shows a relationship between a bit line and a page buffer;
FIG. 12 shows a fluctuation in potential of a bit line;
FIG. 16 shows a third example of the layout according to the invention;
FIG. 20 shows a seventh example of the layout according to the invention;
FIG. 30 shows a method of changing inclination of a conductive line.

DETAILED DESCRIPTION OF THE INVENTION

Figure 4:
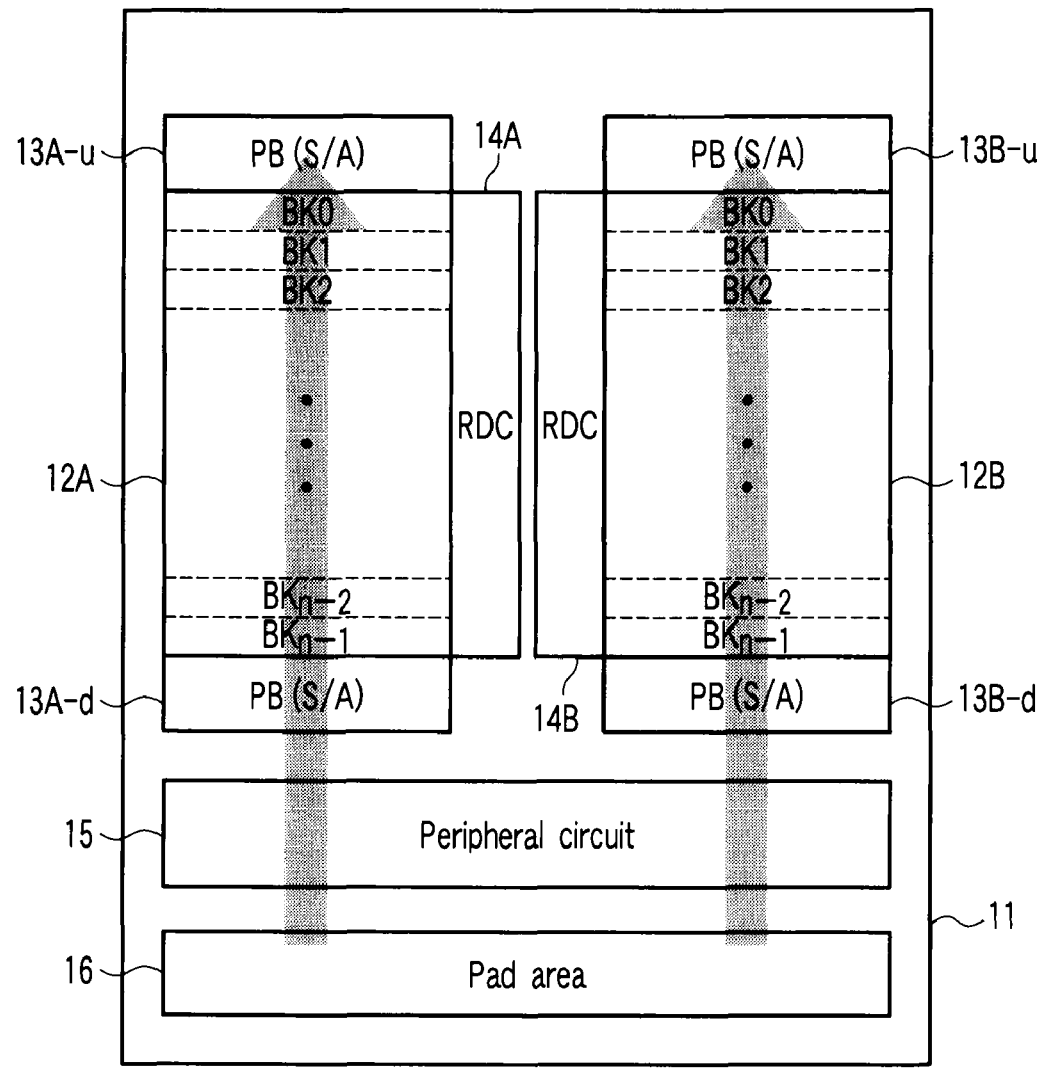
FIG. 4 shows a route of a power supply potential.
Figure 4:
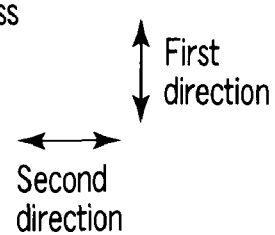

A nonvolatile semiconductor memory of an aspect of the present invention will be described below in detail with reference to the drawings.

1. OUTLINE

In the nonvolatile semiconductor memory, architecture and layout of a circuit are determined in each generation from the viewpoints of chip characteristics and a chip size.

Among them there is disposed a pad only in one side of the chip while page buffers (sense amplifiers) are disposed on both ends on a column direction of the memory cell array.

In this case, it is necessary to consider layout of a power source line in order to stably feed power supply potentials Vdd and Vss to all the circuits in the chip.

As described above, the cell source line and the cell well line are disposed on the memory cell array. Therefore, the power source line is frequently laid out along an edge of the chip except for the area on the memory cell array.

However, unfortunately the layout of the power source line along the edge of the chip enlarges a chip size.

A layout in which the power supply line is disposed on the memory cell array is adopted in an example of the invention.

Additionally, in order to correspond to memory core architecture in which the page buffers (sense amplifiers) are disposed on both ends in a first direction (column direction) of the memory cell array, a power supply potential is supplied from a power supply pad disposed on one end in the first direction of the memory cell array to the page buffer disposed on the other end in the first direction of the memory cell array using a power supply line according to an example of the invention.

Therefore, the power supply potentials Vdd and Vss can stably be supplied to all the circuits disposed in the chip without increasing the chip size.

The cell source line and cell well line which are disposed on the memory cell array are also disposed in the same conductive layer as the power supply line according to an example of the invention. In this case, the power supply line, the cell source line, and the cell well line are arranged together, and the cell source line and the cell well line are disposed on a shunt area in the memory cell array, which allows resistances to be decreased in all the conductive lines.

When the power supply line is disposed on the memory cell array, sometimes a parasitic capacitance between the power supply line and another conductive line (such as a bit line) becomes troublesome.

For example, the erase potential charges up the bit line through a drain diffusion layer of the cell unit, when an erase potential is given to a cell well area during an erase operation. Then, when the cell well area becomes a ground potential, because an area covered with the power supply line differs from an area not covered with the power supply line in a speed of a decrease in potential at the bit line, it is difficult to determine a timing at which the potential at the bit line is forcibly discharged.

Therefore, first a layout in which the power supply line on the memory cell array is extending in the first direction in a meandering manner is adopted in an example of the invention.

In this case, a fluctuation in parasitic capacitance generated in the bit line can be decreased, because a ratio of a portion covered with the power supply line can fall within a predetermined range for all the bit lines. Therefore, the large fluctuation is not generated in the speed of the decrease in potential at the bit line BL during the erase operation.

Second, in an example of the invention, there is adopted architecture, in which the power supply line is also disposed in the area except for that on the memory cell array and the power supply line on the memory cell array is set in a floating state during the erase operation.

In this case, similarly to the case in which the bit line is meandering, the generation of the large fluctuation is can be prevented in the speed of the decrease in potential at the bit line BL during the erase operation.

2. EXAMPLES

Then, some examples will be described below.

(1) Chip Layout

FIG. 1 shows an example of chip layout to which the invention is applied.

A necessary point of the chip layout is a pad area (power supply pad) is disposed on one end in the first direction of the memory cell arrays 12A and 12B while page buffers (sense amplifiers) 13A-u and 13B-u are disposed on the other hand in the first direction of the memory cell arrays 12A and 12B.

The layout of FIG. 1 is used in the case where the all-bit-line (ABL) sense amplifier architecture, in which all the bit lines can simultaneously be sensed is, adopted, or in the case where a layout pitch is loosened in bit-line shielding sense amplifier architecture.

The detailed layout will be described.

A chip 11 has a rectangular shape, and the two memory cell arrays 12A and 12B are disposed on the chip 11. However, the one memory cell array may be disposed on the chip 11 or three or more memory cell arrays may be disposed on the chip 11.

The memory cell arrays 12A and 12B includes n (n is a natural number of two or larger) blocks BK0, BK1, ..., and BKn-1 arranged in the first direction.

Each of the blocks BK0, BK1, ..., and BKn-1 includes plural cell units CU arranged in a second direction orthogonal to the first direction.

As shown in FIG. 2, in the case of a NAND flash memory, the cell unit CU is a NAND string including plural memory cells MC connected in series in the first direction and two select gate transistors ST connected on both ends of the plural memory cells MC.

Plural bit lines BL extending in the first direction are disposed on the memory cell arrays 12A and 12B.

Page buffers (PB) 13A-u, 13B-u, 13A-d, and 13B-d are disposed at both ends in the first direction of the memory cell arrays 12A and 12B.

The page buffers 13A-u, 13B-u, 13A-d, and 13B-d have the function of tentatively storing read data/write data during read/write. The page buffers 13A-u, 13B-u, 13A-d, and 13B-d function as a sense amplifier (S/A) during read or during verifying write/erase operation.

Each of row decoders (RDC) 14A and 14B is disposed at one end (in an opposite portion to end portion on an edge side of the chip 11) in the second direction of each of the memory cell arrays 12A and 12B. Alternatively, the row decoders may be disposed at both ends in the second direction of the memory cell arrays 12A and 12B.

The former layout is called one-side row decoder architecture because the row decoder is disposed only on one side of the memory cell array, and the latter layout is called both-side row decoder because the row decoders are disposed on both ends of the memory cell array.

A pad area 16 is disposed along an edge of the chip 11 on one end in the first direction of the memory cell arrays 12A and 12B. A peripheral circuit 15 is disposed between the page buffers 13A-d and 13B-d and the pad area 16.

FIG. 3 shows a relationship between the bit line and the page buffer.

In the memory cell arrays 12A and 12B, m (m is a natural number of two or larger) bit lines BL0, BL1, ..., and BLm-1 are disposed.

The bit lines BL0, BL2, ..., and BLm-2 are connected to the page buffers 13A-u and 13B-u, and the bit lines BL1, BL3, ..., and BLm-1 are connected to the page buffers 13A-d and 13B-d.

However, because the architecture of FIG. 3 is illustrated by way of example, the connection relationship between the bit line and the page buffer is not limited to the relationship of FIG. 3.

Alternatively, for example, architecture in which the bit lines BL0, BL1, BL4, BL5, ... are connected to the page buffers 13A-u and 13B-u while the bit lines BL2, BL3, BL6, BL7, ... are connected to the page buffer 13A-d and 13B-d may be adopted instead of the architecture of FIG. 3.

In the architecture of FIG. 3, as shown by an arrow of FIG. 4, the power supply potentials Vdd and Vss are supplied from the pad area (power supply pad) 16 disposed on one end of the memory cell arrays 12A and 12B to the page buffers 13A-u and 13B-u disposed on the other end of the memory cell arrays 12A and 12B.

(2) Power Supply Line Layout

A specific example of power supply line layout will be described below.

A. First Example

Figure 5:
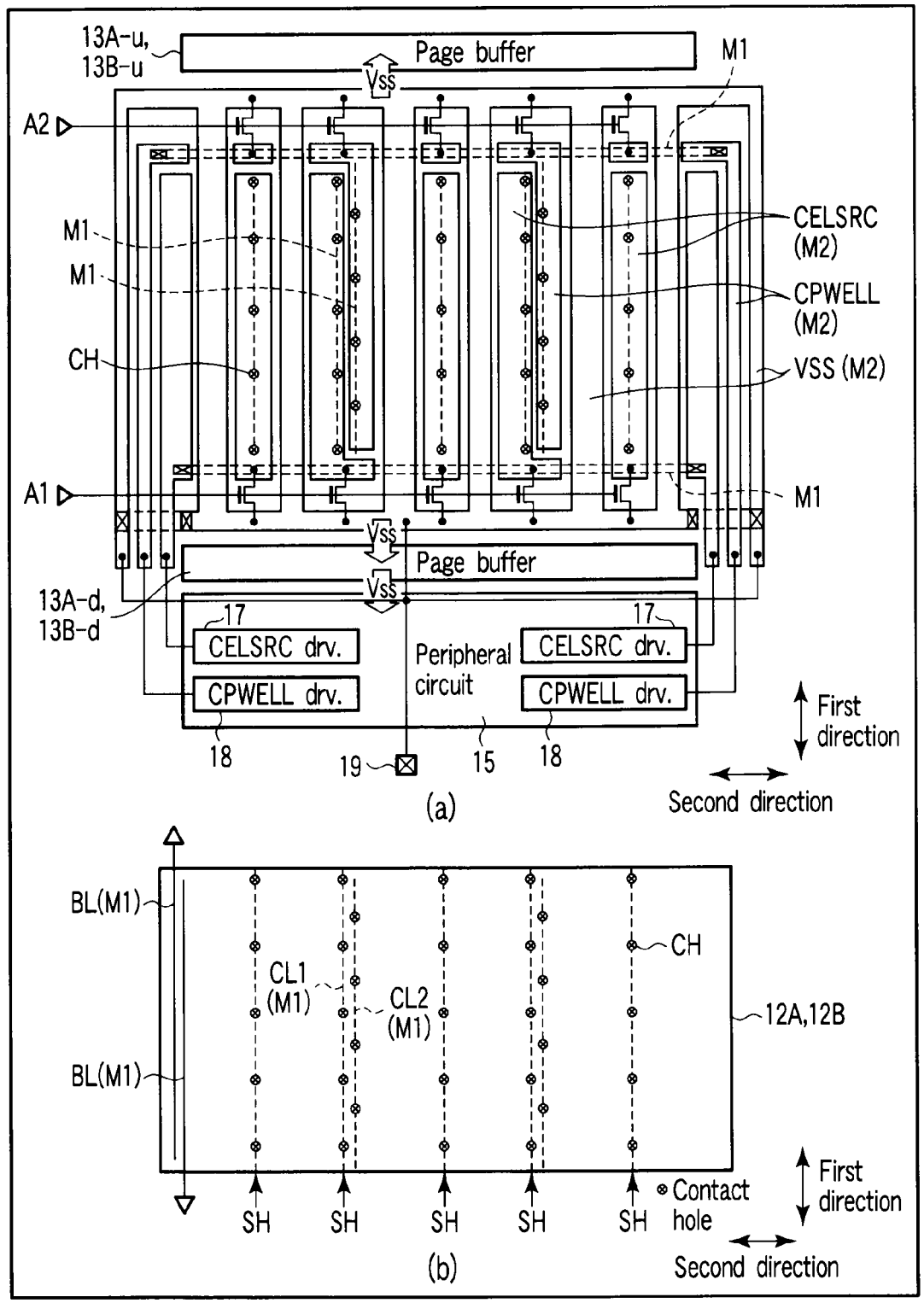
FIG. 5 shows a first example of layout according to the invention.

FIG. 5 shows a first example of the power supply line layout.

FIG. 5(a) shows layout of one of the plural metal layers disposed in the memory cell array, e.g., the conductive line in a third metal layer M2 from the semiconductor substrate side. FIG. 5(b) shows the conductive line and memory cell array disposed immediately below the conductive line of FIG. 5(a).

The bit line BL extending in the first direction is disposed on the memory cell arrays 12A and 12B. The bit line BL is disposed in a second metal layer M1 from the semiconductor substrate side. Shunt areas SH extending in the first direction are disposed in the memory cell arrays 12A and 12B.

The shunt areas SH are disposed at predetermined intervals in the second direction.

The shunt area SH is an area where a shunt interconnection and contact holes are made to decrease the resistances of a cell source line, a well interconnection, and a select gate line.

Conductive lines CL1 and CL2 extending in the first direction are disposed on the shunt area SH. The conductive lines CL1 and CL2 are disposed in the second metal layer M1 from the semiconductor substrate side.

A power supply line Vss is disposed on the bit line BL on the memory cell arrays 12A and 12B. The power supply line Vss extending in the first direction supplies the ground potential d to the page buffers 13A-u, 13B-u, 13A-d, and 13B-d. The power supply line Vss is disposed in the third metal layer M2 from the semiconductor substrate side.

The power supply line Vss is also disposed in the area except for that on the memory cell arrays 12A and 12B. That is, in the area except for that on the memory cell arrays 12A and 12B, the power supply line Vss is disposed in the metal layers M1 and M2, and the power supply line Vss has a pattern surrounding the memory cell arrays 12A and 12B.

As a result, the power supply line Vss becomes ladder-shaped layout as a whole.

The power supply line Vss is connected to a power supply pad 19. The power supply line Vss is formed in a network shape such that the high-resistance area is not formed in the page buffer or peripheral circuit. The power supply line Vss is connected to the power supply (Vss) pad 19 through the network-shape interconnection.

In the first example, only the one power supply pad 19 is illustrated. Alternatively, plural power supply pads 19 may be provided in the pad area on the chip.

A cell source line CELSRC and a cell well line CPWELL are disposed on the bit line BL and conductive lines CL1 and CL2 on the memory cell arrays 12A and 12B The cell source line CELSRC is extending in the first direction, and the cell source line CELSRC supplies a predetermined potential (such as a ground potential) to the source diffusion layer of the cell unit in the memory cell arrays 12A and 12B through the shunt area SH. The cell source line CELSRC is disposed in the third metal layer M2 from the semiconductor substrate side.

The cell well line CPWELL extending in the first direction supplies a predetermined potential (such as a ground potential and an erase potential) to the cell well area in the memory cell arrays 12A and 12B through the shunt area SH. The cell well line CPWELL is disposed in the third metal layer M2 from the third semiconductor substrate side.

The cell source line CELSRC and the cell well line CPWELL are connected to the conductive lines CL1 and CL2 located below the cell source line CELSRC and the cell well line CPWELL through contact holes CH.

The cell source line CELSRC is connected to a cell source line driver (CELSRC drv.) 17, and the cell well line CPWELL is connected to a cell well driver (CPWELL drv.) 18.

The power supply line Vss, the cell source line CELSRC, and the cell well line CPWELL are arranged in the same conductive layer, i.e., the third metal layer M2 from the semiconductor substrate side.

A control signal A1 is one which supplies the ground potential to the cell source line CELSRC, and a control signal A2 is one which supplies the ground potential to the cell well line CPWELL.

Figure 6:
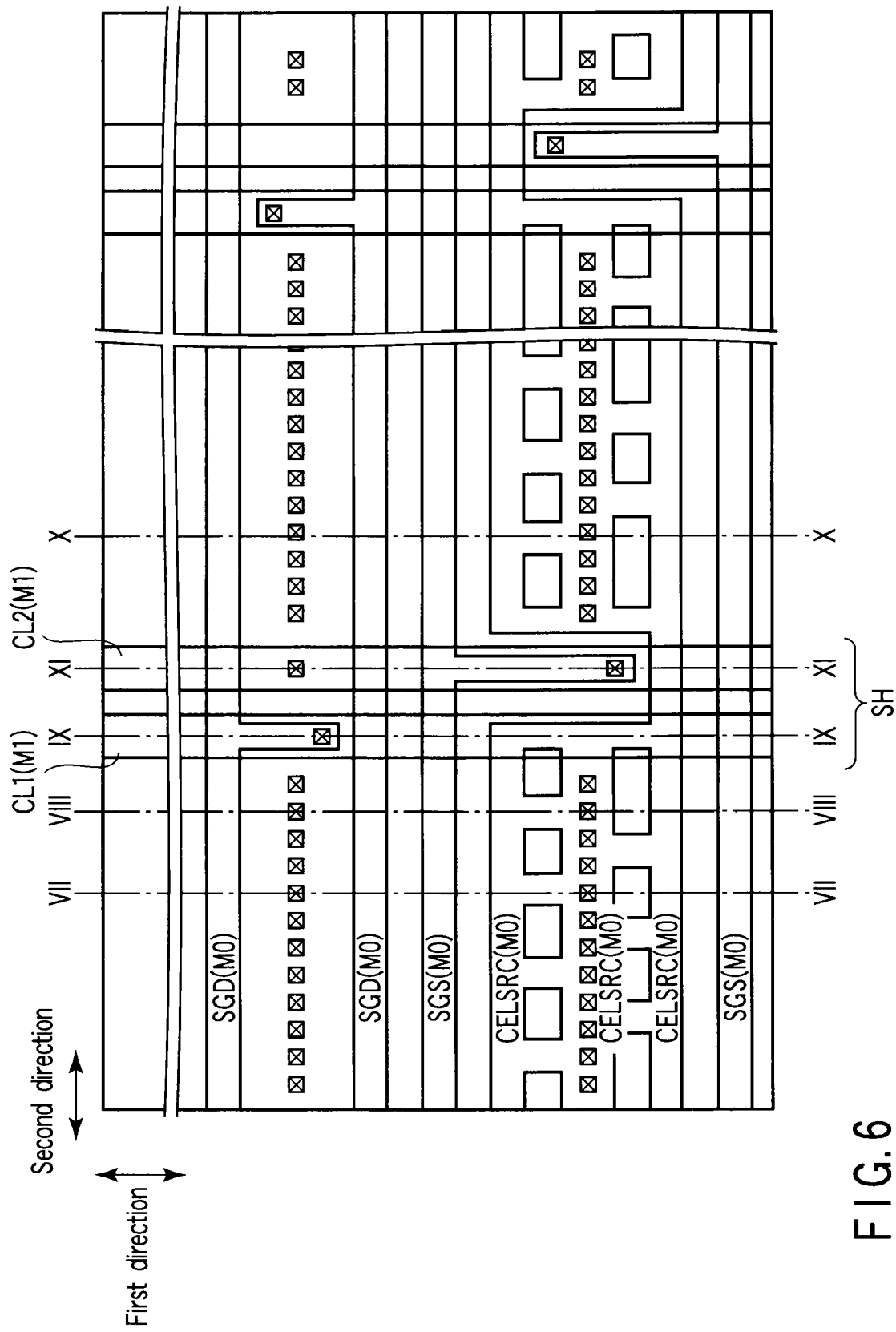
FIG. 6 is a plan view showing an example of a device structure.

FIG. 6 shows an example of layout of a metal layer M0 in the memory cell array of FIG. 5.

Figure 7:
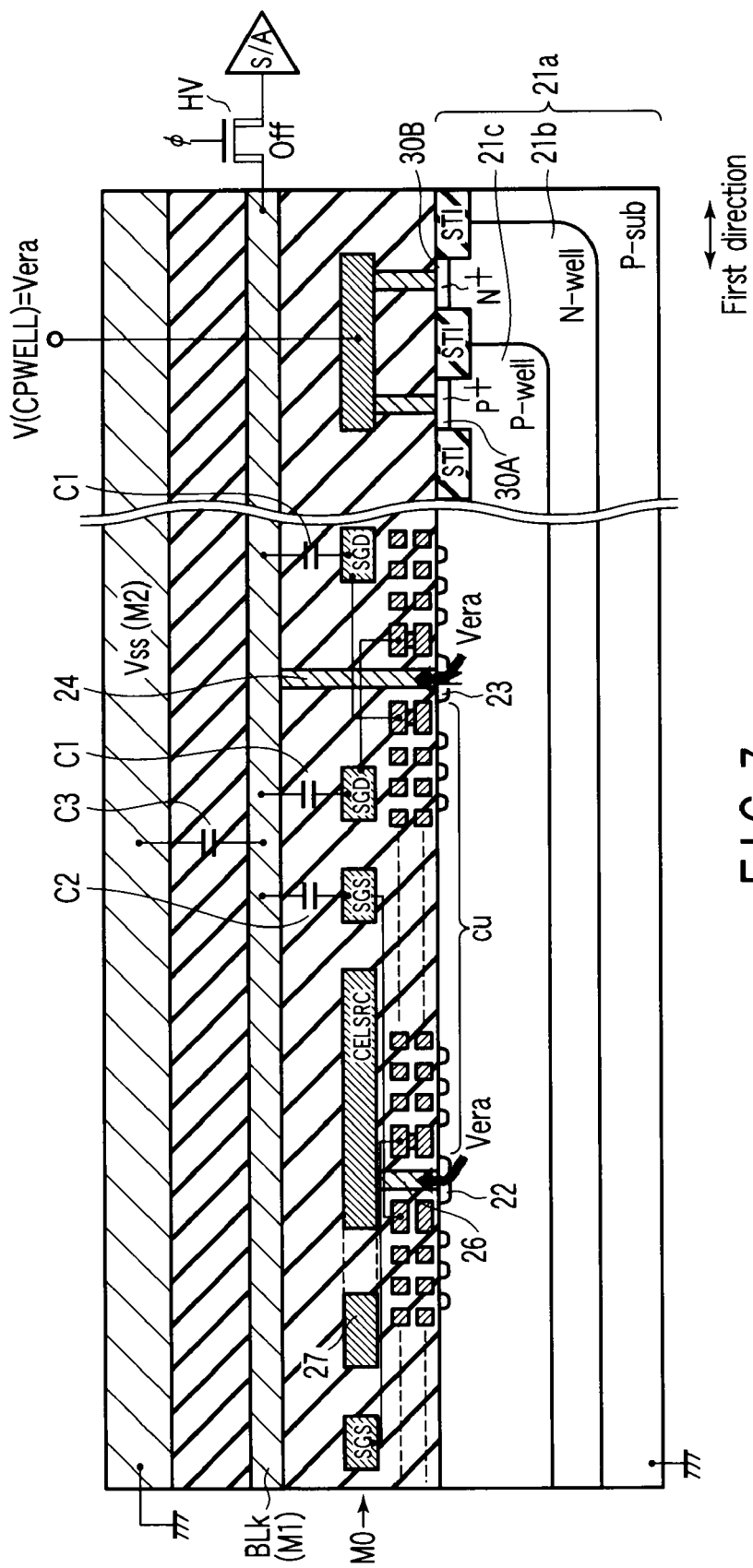
FIG. 7 is a sectional view taken along a line VII-VII of FIG. 6.

FIG. 7 is a sectional view taken along a line VII-VII of FIG. 6.

Specifically, FIG. 7 is a sectional view in the first direction of the area where the power supply line Vss is disposed on the bit line BLk on the cell unit CU.

A double well area including an N-type well area 21b and a P-type well area 21c is formed in a P-type semiconductor substrate 21a.

The cell unit CU is formed in the P-type well area 21c. The cell unit CU is the NAND string including the plural memory cells connected in series and the two select gate transistors connected on both ends of the plural memory cells.

The plural memory cells are connected in series by n-type diffusion layer in the P-type well area 21c. A source diffusion layer 22 is formed on one end of the cell unit CU, and a drain diffusion layer 23 is formed on the other end. The drain diffusion layer 23 on the other end of the cell unit CU is connected to the bit line BLk through a contact plug 24. The bit line BLk is disposed in the second metal layer M1 from the side of the semiconductor substrate 21a.

The power supply line Vss is disposed in the bit line BLk. The power supply line Vss is disposed in the third metal layer M2 from the side of the semiconductor substrate 21a.

Figure 8:
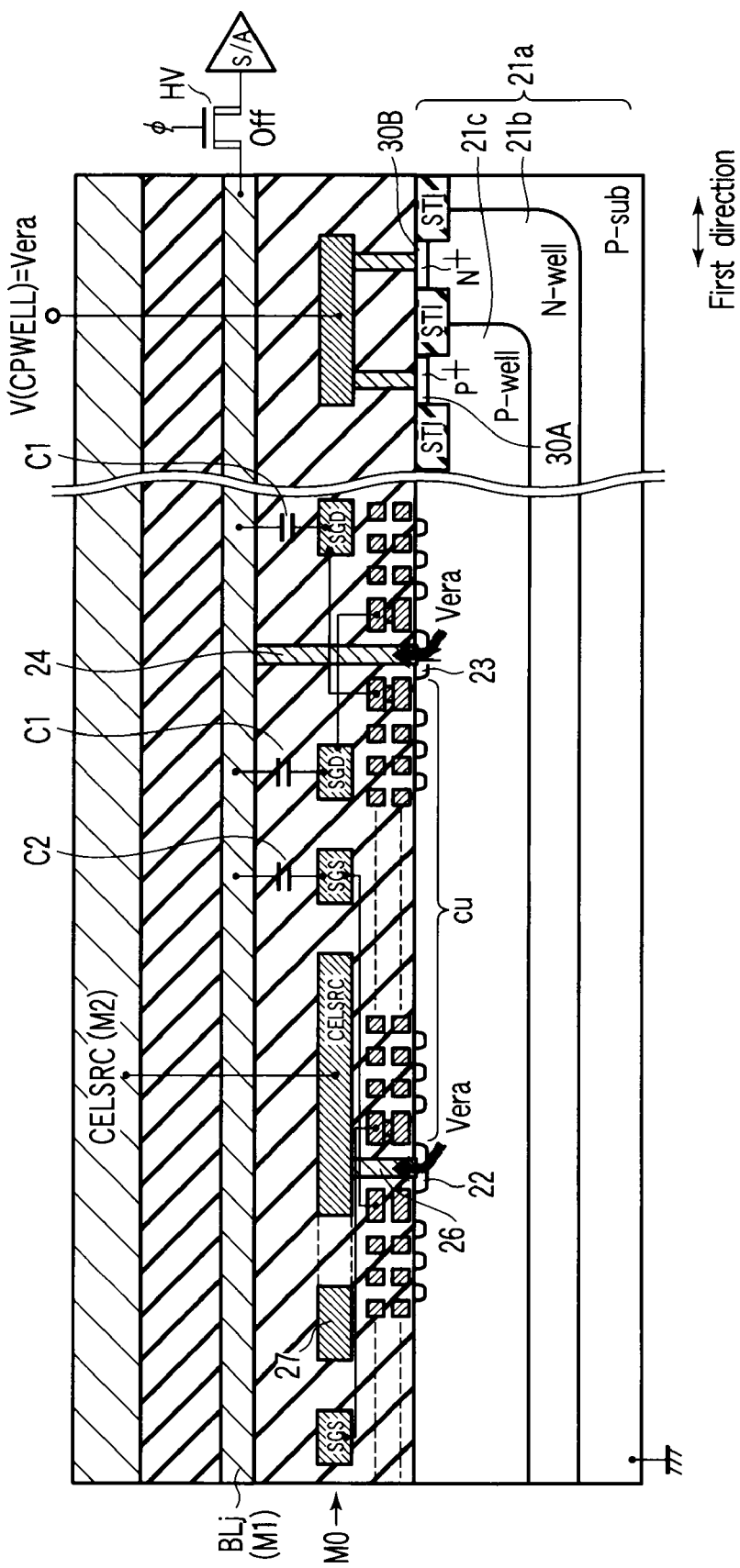
FIG. 8 is a sectional view taken along a line VIII-VIII of FIG. 6.
Figure 9:
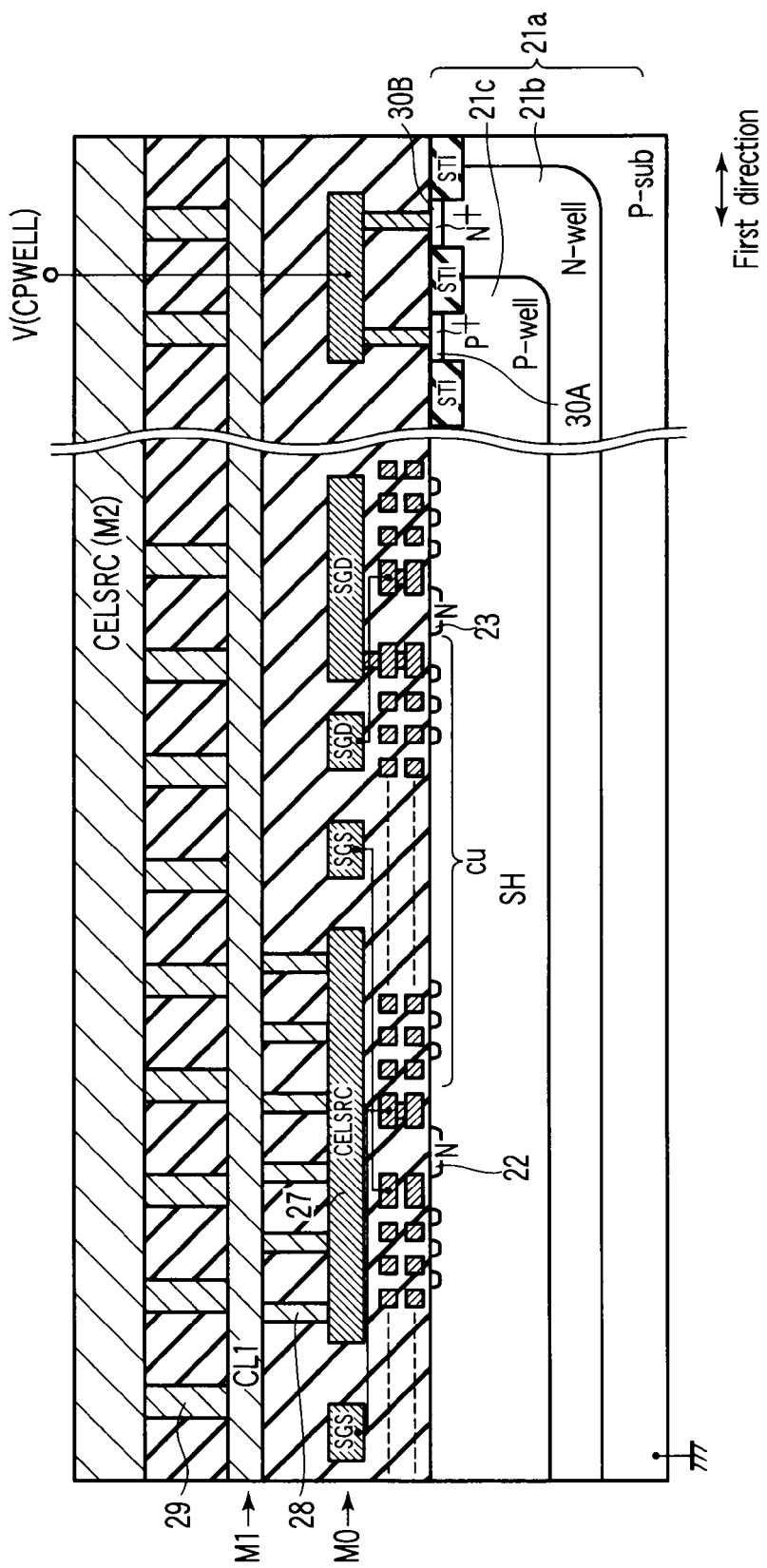
FIG. 9 is a sectional view taken along a line IX-IX of FIG. 6.

FIG. 8 is a sectional view taken along a line VIII-VIII of FIG. 6, and FIG. 9 is a sectional view taken along a line IX-IX of FIG. 6.

Specifically, FIG. 8 is a sectional view in the first direction of the area where the cell source line CELSRC is disposed on the bit line BLj on the cell unit CU. FIG. 9 is a sectional view in the first direction of the area where the cell source line CELSRC is disposed on the shunt area SH.

The source diffusion layer 22 of the cell unit CU is connected to a conductive line 27 through a contact plug 26, and the conductive line 27 is disposed in the first metal layer M0 from the side of the semiconductor substrate 21a. The conductive line 27 is drawn to the shunt area SH with a pattern shown in FIG. 6.

In the shunt area SH, the conductive line 27 is connected to the conductive line CL1 through a contact plug 28, and the conductive line CL1 is disposed in the second metal layer M1 from the side of the semiconductor substrate 21a. The conductive line CL1 is connected to the cell source line CELSRC through a contact plug 29, and the cell source line CELSRC is disposed in the third metal layer M2 from the side of the semiconductor substrate 21a.

For the purpose of easy understanding, the contact plugs 28 and 29 of FIG. 9 are not shown in FIG. 6.

Figure 10:
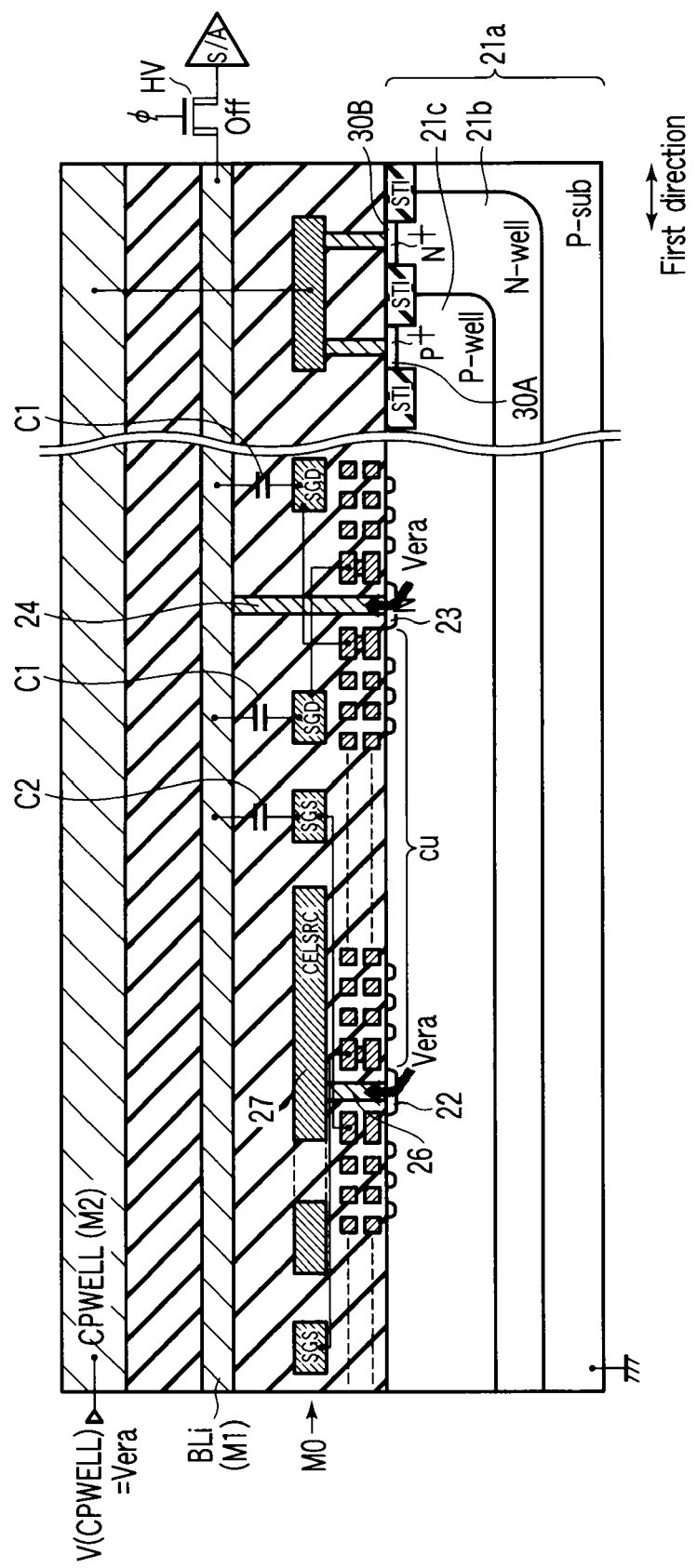
FIG. 10 is a sectional view taken along a line X-X of FIG. 6.
Figure 11:
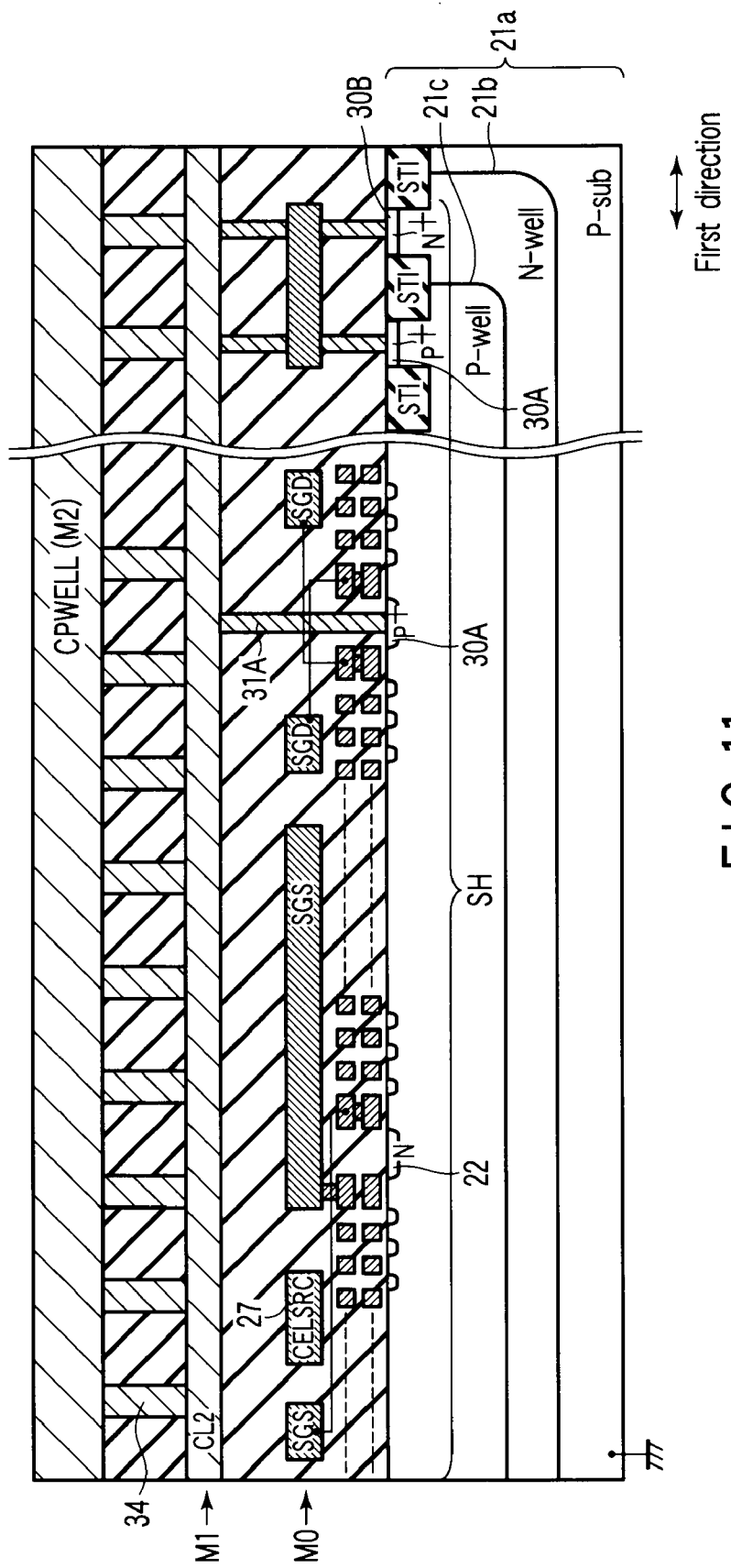
FIG. 11 is a sectional view taken along a line XI-XI of FIG. 6.

FIG. 10 is a sectional view taken along a line X-X of FIG. 6, and FIG. 11 is a sectional view taken along a line XI-XI of FIG. 6.

Specifically, FIG. 10 is a sectional view in the first direction of the area where the cell well line CPWELL is disposed on the bit line BLi on the cell unit CU. FIG. 11 is a sectional view in the first direction of the area where the cell well line CPWELL is disposed on the shunt area SH.

A $P^+$-type contact area 30A in the P-type well area 21c is connected to the conductive line CL2 through a contact plug 31A, and the conductive line CL2 is disposed in the metal layer M1.

Similarly, an $N^+$-type contact area 30B in the N-type well area 21b is connected to the conductive line 32B through a contact plug 31B, and the conductive line 32B is disposed in the metal layer M0. The conductive line 32B is connected to the conductive line CL2 through a contact plug 33B, and the conductive line CL2 is disposed in the metal layer M1.

The conductive line CL2 is connected to the cell well line CPWELL through a contact plug 34, and the cell well line CPWELL is disposed in the metal layer M2.

Thus, according to the layout of the first example, the power supply line Vss is disposed in the area on the memory cell array, which allows the power supply potential to be stably supplied to all the circuits disposed in the chip without enlarging the chip size.

When the power supply line is disposed on the memory cell array, sometimes the parasitic capacitance between the power supply line and another conductive line (such as bit line) becomes troublesome.

For example, as shown in FIGS. 7 to 11, during the erase operation, first a transistor HV is turned off to set in the cell source line CELSRC in the floating state while setting the bit lines BLi, BLj, and BLk in the floating state.

Then, when an erase potential (for example, 20V) Vera is given to the cell well areas 21b and 21c, the erase potential Vera charges up the cell source line CELSRC through the source diffusion layer 22 of the cell unit CU and also charges up the bit lines BLi, BLj, and BLk through the drain diffusion layer 23.

Accordingly, the potential at the cell source line CELSRC and the potentials at the bit lines BLi, BLj, and BLk become (Vera−Vf) in which a voltage drop Vf caused by a PN junction is subtracted from the erase potential Vera respectively.

At this point, in the place where the power supply line Vss is disposed on the bit line, it is necessary that a parasitic capacitance C3 between the bit line BLk and the power supply line Vss is charged up to (Vera−Vf) as shown in FIG. 7.

Therefore, a load is increased on a potential generation circuit which generates the erase potential Vera, and possibly the memory cell is not completely erased due to the lack of capacity of the potential generation circuit.

The parasitic capacitance C3 is generated in the bit line BLk covered with the power supply line Vss as shown in FIG. 7, and the parasitic capacitance C3 is not generated in the bit lines BLi and BLj which are not covered with the power supply line Vss as shown in FIGS. 8 and 10.

This means that the parasitic capacitance generated in the bit line depends on the bit line BL during the erase operation. In this case, the fluctuations in potential at the bit lines BLi, BLj, and BLk vary as shown in FIG. 12.

Particularly, when the cell well areas 21b and 21c are changed from the erase potential Vera to the ground potential, the speed of the decrease in potential at the bit line BLk covered with the power supply line Vss becomes slower than those of the bit lines BLi and BLj which are not covered with the power supply line Vss.

The phenomenon is unfavorable from the standpoint of the prediction of the potential at the bit line.

Usually, the potential at the bit line is predicted bit line after the erase operation, and the potential at the bit line is forcibly discharged at the time the potential at the bit line is lower than a predetermined value. However, when the potential at the bit line is improperly predicted, the discharge is forcibly performed while the potential at the bit line exceeds the predetermined value, which results in breakdown of the element.

Therefore, the following second to eighth examples propose power supply line layout in which the fluctuation in parasitic capacitance generated in the bit line falls within a predetermined range during the erase operation.

B. Second Example

Figure 13:
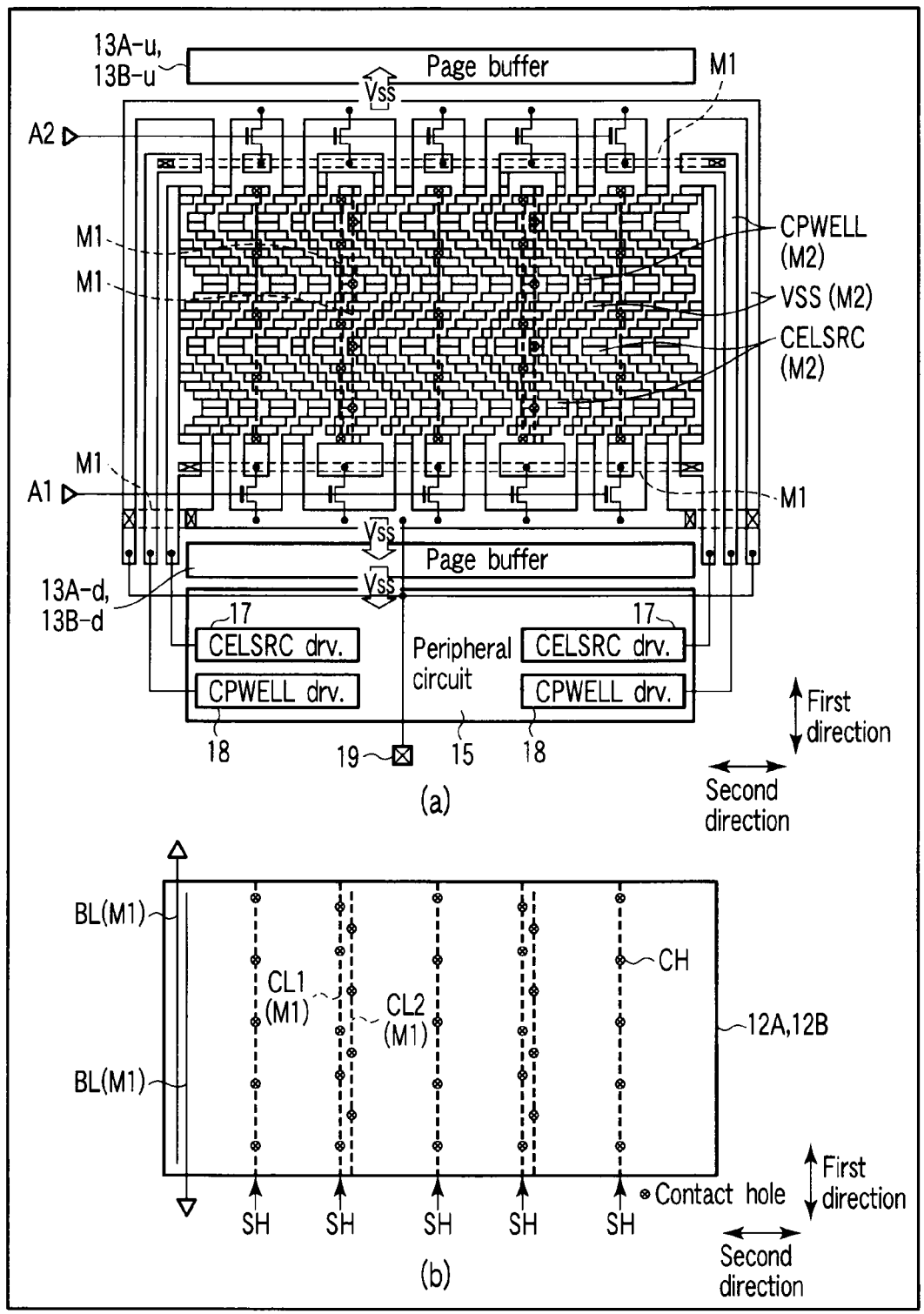
FIG. 13 shows a second example of the layout according to the invention.

FIG. 13 shows a second example of the power supply line layout.

FIG. 13(a) shows the layout of the conductive line in one of the plural metal layers disposed on the memory cell array, e.g., in the third metal layer M2 from the semiconductor substrate side. FIG. 13(b) shows the conductive line and memory cell array which are disposed immediately below the conductive line of FIG. 13(a).

The layout of the second example differs from the layout of the first example in that the power supply line Vss is extended in the first direction in a meandering manner. Other configurations are similar to those of the first example.

Similarly to the power supply line Vss, the cell source line CELSRC and cell well line CPWELL which are disposed in the same conductive layer (third metal layer M2) as the power supply line Vss are also extending in the first direction in a meandering manner.

In the second example, the fluctuation in parasitic capacitance generated in the bit line BL can be decreased because a ratio (coverage) of the portion covered with the power supply line Vss can fall within a predetermined range for all the bit lines BL disposed in the second metal layer M1 immediately below the power supply line Vss. Therefore, the large fluctuation is not generated in the speed of the decrease in potential at the bit line BL during the erase operation.

The layout of the second example will specifically be described.

The bit line BL extending in the first direction is disposed on the memory cell arrays 12A and 12B. The shunt areas SH extending in the first direction are disposed on the memory cell arrays 12A and 12B.

The shunt areas SH are disposed at predetermined intervals in the second direction. The bit line BL is not disposed in the shunt area SH, and contact holes are made for the cell well area and the source diffusion layer of the cell unit.

The conductive lines CL1 and CL2 extending in the first direction are disposed on the shunt area SH.

The power supply line Vss is disposed on the bit line BL on the memory cell arrays 12A and 12B. The power supply line Vss is extending in the meandering manner in the first direction, and the power supply line Vss supplies the ground potential to the page buffers 13A-u, 13B-u, 13A-d, and 13B-d.

Figure 14:
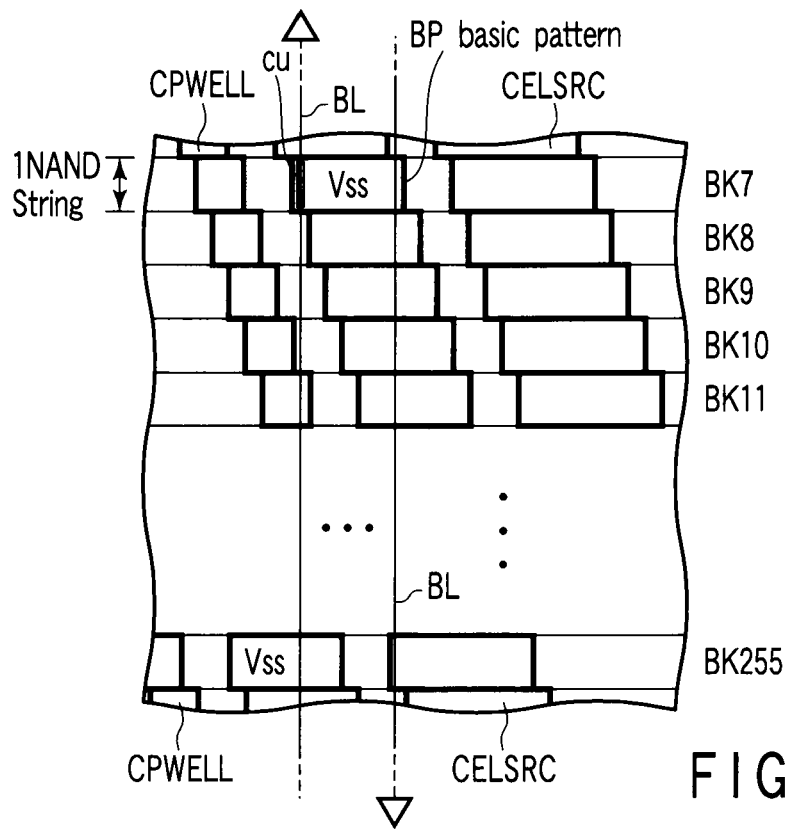
FIG. 14 shows an example of a basic pattern.
Figure 15:
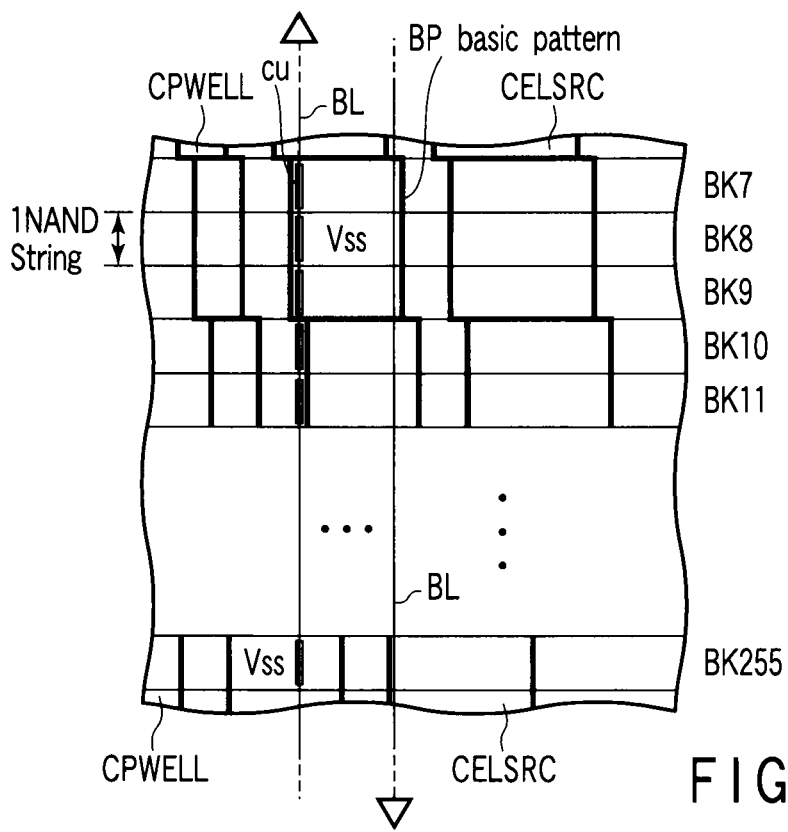
FIG. 15 shows an example of the basic pattern.

In order to extend the power supply line Vss in the meandering manner, preferably the power supply line Vss is formed by a combination of plural basic patterns BP as shown in FIGS. 14 and 15.

The size in the first direction of each of the plural basic patterns BP is formed such that at least one cell unit (NAND string) is covered with the each of the plural basic patterns BP, and the size in the second direction of each of the plural basic patterns BP is formed such that at least two bit lines BL are covered with each of the plural basic patterns BP.

In the second example, the power supply line Vss can easily be formed in the meandering manner as a whole, when the position of the basic pattern BP is shifted by at least one bit line BL in the second direction every time the position of the basic pattern BP is shifted by one in the first direction.

When the power supply line Vss can easily be formed in the meandering manner, the coverage of the power supply line Vss to the one bit line BL can be computed only by counting the number of basic patterns BP with which the one bit line BL is covered. Therefore, characteristic evaluation can easily be performed with respect to the bit line BL while the coverage of the power supply line Vss can fall within the predetermined range for all the bit lines BL to decrease the fluctuation in parasitic capacitance generated in the bit line BL.

With reference to misalignment generated in lithography, the misalignment in the second direction of the basic pattern BP has a little influence on the coverage of the power supply line Vss. This is because all the patterns are simultaneously shifted toward the same direction.

Even if a width of the basic pattern BP is changed by a difference in critical dimension of etching of the metal layer M2, because the covering of the metal layer M2 is substantially evenly changed for all the bit lines, the fluctuation in parasitic capacitance to the metal layer M2 can be suppressed with respect to the bit line.

The power supply line Vss is connected to the power supply pad 19.

The cell source line CELSRC and the cell well line CPWELL are disposed on the bit line BL of the memory cell array 12A and 12B and on the conductive lines CL1 and CL2.

Similarly to the power supply line Vss, the cell source line CELSRC is extending in the meandering manner in the first direction, and the cell source line CELSRC supplies a predetermined potential (such as a ground potential) to the source diffusion layer of the cell unit in the memory cell arrays 12A and 12B through the shunt area SH.

Similarly to the power supply line Vss, the cell well line CPWELL is extending in the meandering manner in the first direction, and the cell well line CPWELL supplies a predetermined potential (such as a ground potential and an erase potential) to the cell well area in the memory cell arrays 12A and 12B through the shunt area SH.

Similarly to the power supply line Vss, preferably the cell source line CELSRC and the cell well line CPWELL are formed by the combination of the basic patterns BP as shown in FIGS. 14 and 15.

The cell source line CELSRC and the cell well line CPWELL are connected to the conductive lines CL1 and CL2 located below the cell source line CELSRC and the cell well line CPWELL through the contact holes CH.

The cell source line CELSRC is connected to the cell source line driver (CELSRC drv.) 17, and the cell well line CPWELL is connected to the cell well driver (CPWELL drv.) 18.

The device structure of the memory cell array of FIG. 13 is similar to the structures shown in FIGS. 7 to 11.

Thus, according to the layout of the second example, the power supply line Vss is disposed in the area on the memory cell array, which allows the power supply potential to be stably supplied to all the circuits disposed in the chip without enlarging the chip size.

Even if the power supply line Vss is disposed on the memory cell array, because the fluctuation in parasitic capacitance generated in the bit line BL can fall within a predetermined range. Therefore, the large fluctuation is not generated in the speed of the decrease in potential at the bit line BL during the erase operation.

C. Third Example

FIG. 16 shows a third example of the power supply line layout.

FIG. 16(a) shows the layout of the conductive line in one of the plural metal layers disposed on the memory cell array, e.g., in the third metal layer M2 from the semiconductor substrate side. FIG. 16(b) shows the conductive line and memory cell array which are disposed immediately below the conductive line of FIG. 16(a).

The third example is a modification of the second example.

The layout of the third example differs from the layout of the second example in that a side of the power supply line Vss is changed not in a step manner (second example) but in a smooth manner. That is, in the third example, the power supply line Vss is not formed by the combination of the plural basic patterns. Other configurations are similar to those of the second example.

The sides of the cell source line CELSRC and cell well line CPWELL, disposed in the same conductive layer (third metal layer M2) as the power supply line Vss, are smoothly changed.

In the third example, because the ratio (coverage) of the portion covered with the power supply line Vss can fall within a predetermined range for all the bit lines, the fluctuation in parasitic capacitance generated in the bit line BL can be decreased. Therefore, the large fluctuation is not generated in the speed of the decrease in potential at the bit line BL during the erase operation.

D. Fourth Example

Figure 17:
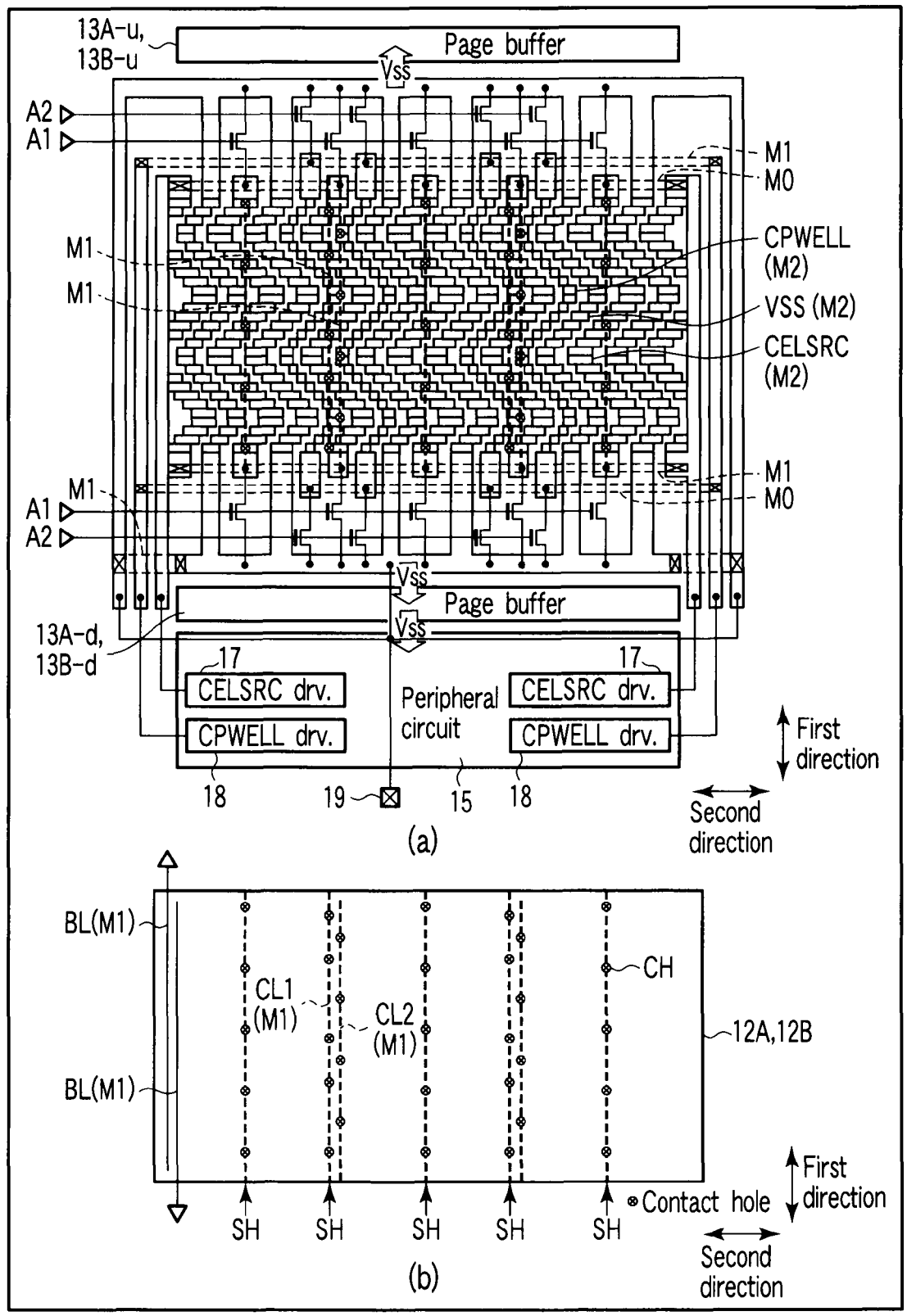
FIG. 17 shows a fourth example of the layout according to the invention.

FIG. 17 shows a fourth example of the power supply line layout.

FIG. 17(a) shows the layout of the conductive line in one of the plural metal layers disposed on the memory cell array, e.g., in the third metal layer M2 from the semiconductor substrate side. FIG. 17(b) shows the conductive line and memory cell array which are disposed immediately below the conductive line of FIG. 17(a).

The fourth example is also a modification of the second example.

The layout of the fourth example differs from the layout of the second example in architecture in which the ground potential is supplied to the cell source line CELSRC and cell well line CPWELL from both ends of the cell source line CELSRC and cell well line CPWELL on the memory cell arrays 12A and 12B.

When the control signal A1 goes high, a short-circuit is generated between the power supply line Vss and the cell source line CELSRC to supply the ground potential from the power supply pad 19 to the cell source line CELSRC. When the control signal A2 goes high, a short-circuit is generated between the power supply line Vss and the cell well line CPWELL to supply the ground potential from the power supply pad 19 to the cell well line CPWELL.

Other configurations are similar to those of the second example.

In the fourth example, because the ratio (coverage) of the portion covered with the power supply line Vss can fall within a predetermined range for all the bit lines BL, the fluctuation in parasitic capacitance generated in the bit line BL can be decreased. Therefore, the large fluctuation is not generated in the speed of the decrease in potential at the bit line BL during the erase operation.

E. Fifth Example

Figure 18:
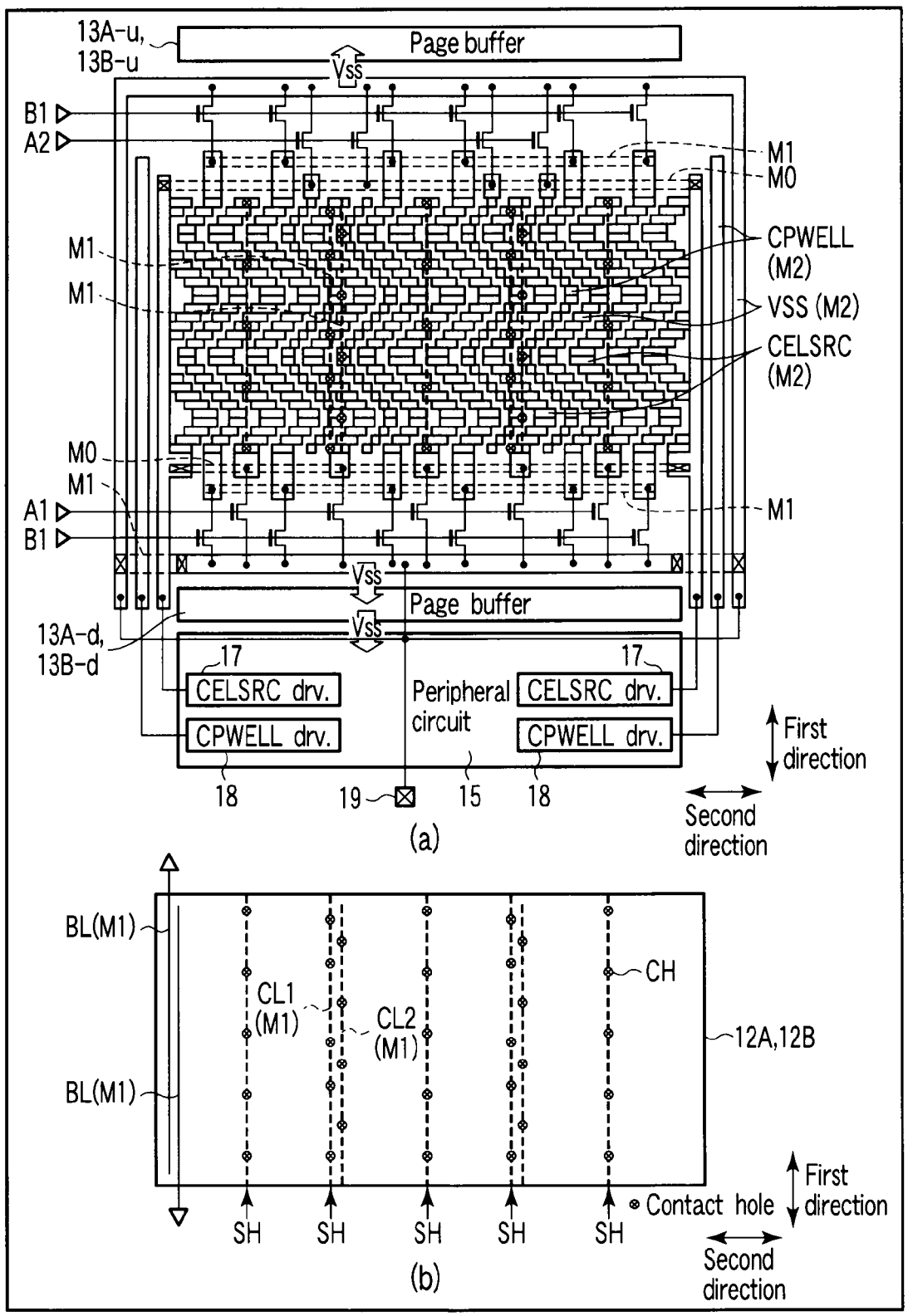
FIG. 18 shows a fifth example of the layout according to the invention.

FIG. 18 shows a fifth example of the power supply line layout.

FIG. 18(*a*) shows the layout of the conductive line in one of the plural metal layers disposed on the memory cell array, e.g., in the third metal layer M2 from the semiconductor substrate side. FIG. 18(*b*) shows the conductive line and memory cell array which are disposed immediately below the conductive line of FIG. 18(*a*).

The fifth example is also a modification of the second example.

The layout of the fifth example differs from the layout of the second example in that a switching element (N-channel MOS transistor) is disposed between the power supply line Vss on the memory cell array 12A and 12B and the power supply line Vss of the area except for that on the memory cell array 12A and 12B and the switching element is controlled by the control signal B1.

The fifth example can adopt architecture, in which the control signal B1 is made low during the erase operation, and the power supply line Vss on the memory cell arrays 12A and 12B is set in the floating state. Accordingly, the parasitic capacitance generated in the bit line BL can be uniformed during the erase operation, and the fluctuation in the speed of the decrease in potential at the bit line can fall within a predetermined range.

Other configurations are similar to those of the second example.

In the layout of the fifth example, the power supply line Vss on the memory cell arrays 12A and 12B is temporarily set in the floating state, so that the fluctuation can be suppressed in the speed of the decrease in potential at the bit line BL during the erase operation.

F. Sixth Example

Figure 19:
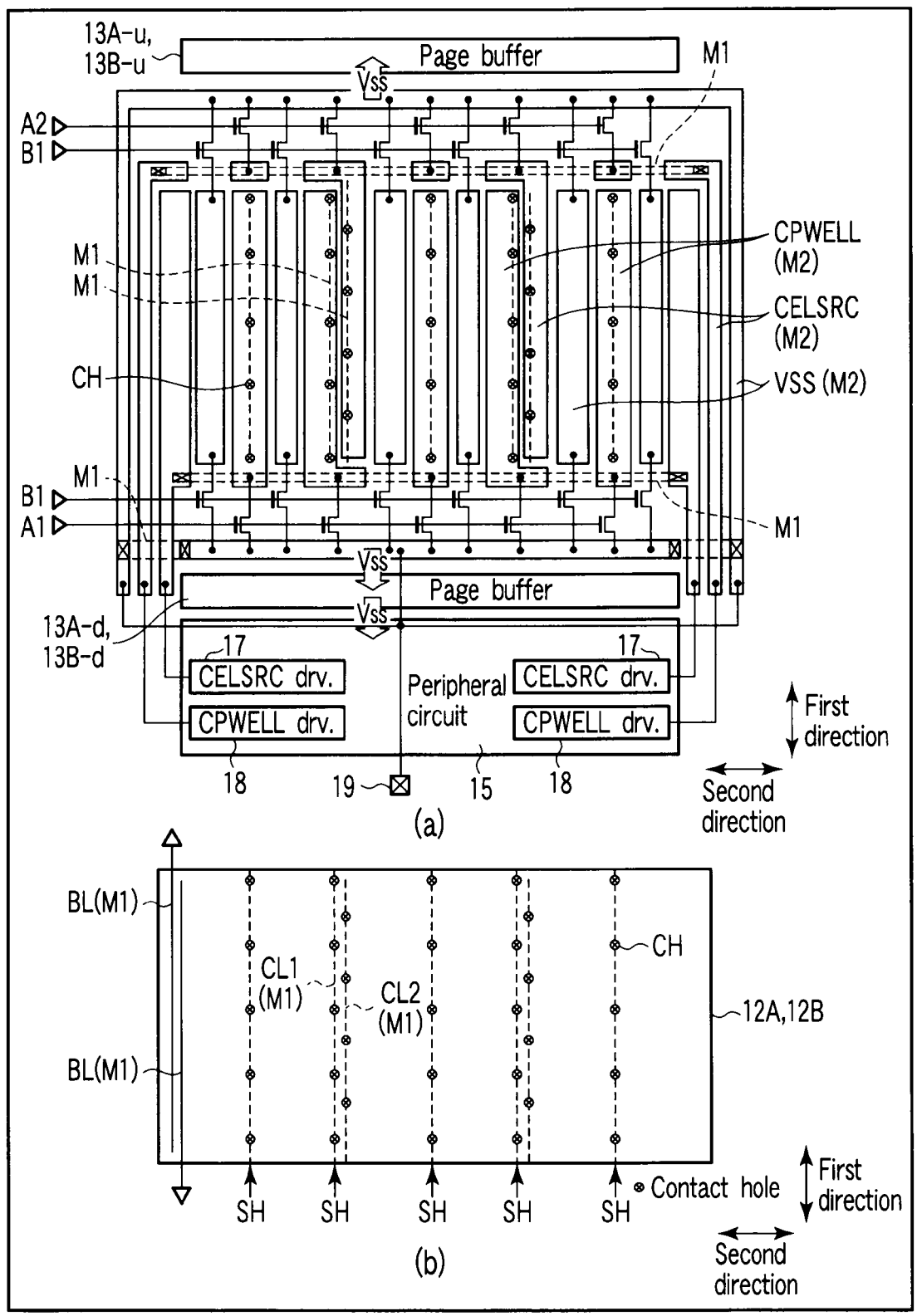
FIG. 19 shows a sixth example of the layout according to the invention.

FIG. 19 shows a sixth example of the power supply line layout.

FIG. 19(*a*) shows the layout of the conductive line in one of the plural metal layers disposed on the memory cell array, e.g., in the third metal layer M2 from the semiconductor substrate side. FIG. 19(*b*) shows the conductive line and memory cell array which are disposed immediately below the conductive line of FIG. 19(*a*).

The sixth example is also a modification of the fifth example.

The layout of the sixth example differs from the layout of the fifth example in that the power supply line Vss is extended not in the meandering manner but in the straight line. That is, in the sixth example, it can be said that the architecture of the fifth example is applied to the first example having the straight power supply line Vss on the memory cell arrays 12A and 12B.

The switching element (N-channel MOS transistor) is disposed between the power supply line Vss on the memory cell array 12A and 12B and the power supply line Vss of the area except for that on the memory cell array 12A and 12B, and the switching element is controlled by the control signal B1.

When the control signal B1 is made low during the erase operation, the power supply line Vss on the memory cell arrays 12A and 12B is set in the floating state, so that the parasitic capacitance generated in the bit line BL can be uniformed during the erase operation.

Other configurations are similar to those of the fifth example.

In the sixth example, similarly to the case in which the power supply line Vss is extending in the meandering manner, even if the power supply line Vss is not extending in the meandering manner, the fluctuation in parasitic capacitance generated in the bit line BL can be decreased. Therefore, the large fluctuation is not generated in the speed of the decrease in potential at the bit line BL during the erase operation.

G. Seventh Example

FIG. 20 shows a seventh example of the power supply line layout.

FIG. 20(*a*) shows the layout of the conductive line in one of the plural metal layers disposed on the memory cell array, e.g., in the third metal layer M2 from the semiconductor substrate side. FIG. 20(*b*) shows the conductive line and memory cell array which are disposed immediately below the conductive line of FIG. 20(*a*).

The seventh example is also a modification of the second example.

The layout of the seventh example differs from the layout of the second example in that the power supply line Vdd is replaced for the power supply line Vss. Other configurations are similar to those of the second example.

A difference between the power supply line Vss and the power supply line Vdd is defined as follows.

In two external power supply potentials inputted to the chip from the outside, the conductive line transmitting the lower potential (ground potential) is set to the power supply line Vss, and the conductive line transmitting the higher potential is set to the power supply line Vdd. It is assumed that the power supply line Vdd includes the stepped-down power supply potential. For example, in the case where 3.3V is supplied as the power supply potential from the outside, the power supply potential stepped down to 2.5V due to a predetermined circuit also includes an application range of the power supply line Vdd.

The two power supply lines Vss and Vdd may be disposed on the memory cell arrays 12A and 12B by the combination of the second and seventh examples. The seventh example may be combined with at least one of the architecture of the third example to the architecture of the fifth example.

In the seventh example, because the ratio (coverage) of the portion covered with the power supply line Vdd can fall within a predetermined range for all the bit lines immediately below the power supply line Vdd, the fluctuation in parasitic capacitance generated in the bit line BL can be decreased. Therefore, the large fluctuation is not generated in the speed of the decrease in potential at the bit line BL during the erase operation.

H. Eighth Example

Figure 21:
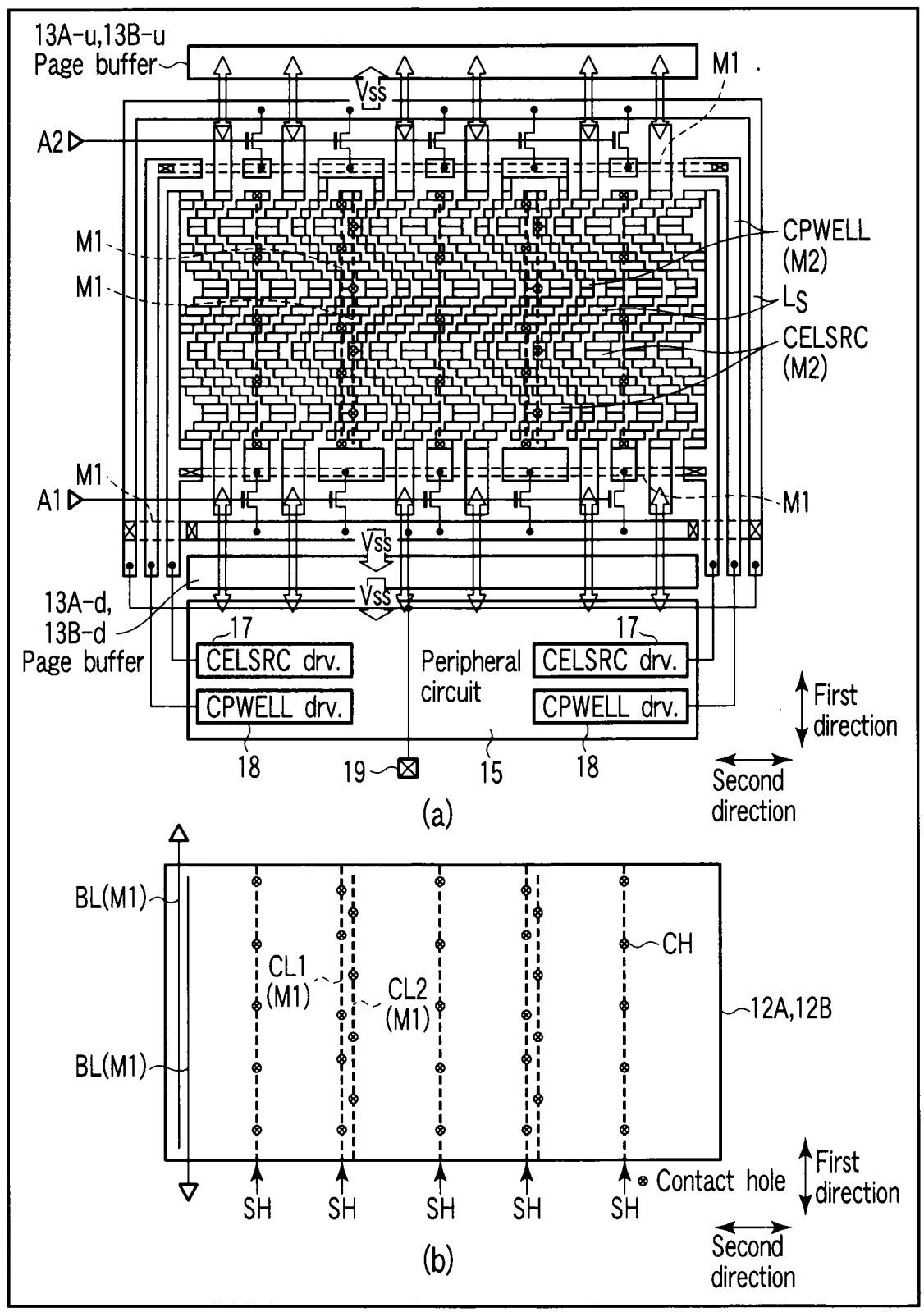
FIG. 21 shows an eighth example of the layout according to the invention.

FIG. 21 shows an eighth example of the power supply line layout.

FIG. 21(*a*) shows the layout of the conductive line in one of the plural metal layers disposed on the memory cell array, e.g., in the third metal layer M2 from the semiconductor substrate side. FIG. 21(*b*) shows the conductive line and memory cell array which are disposed immediately below the conductive line of FIG. 21(*a*).

The eighth example is also a modification of the second example.

The layout of the eighth example differs from the layout of the second example in that a signal line Ls is replaced for the power supply line Vss. Other configurations are similar to those of the second example.

In the case where the signal line Ls is disposed on the memory cell arrays 12A and 12B, the signal line Ls is extending in the meandering manner, which allows the parasitic capacitance of the bit line BL immediately below the signal line Ls to be uniformed.

As used herein, the signal line shall mean conductive lines except for the power supply lines Vss and Vdd. Accordingly, examples of the signal line include a data line clock signal line and a control signal line.

Instead of the signal line, an internal power supply line which transfers an internal power supply potential generated inside the chip may be disposed on the memory cell arrays 12A and 12B. The eighth example may be combined with at least one of the architecture of the third example to the architecture of the fifth example.

In the eighth example, because the ratio (coverage) of the portion covered with the signal line Ls can fall within a predetermined range for all the bit lines immediately below the signal line Ls, the fluctuation in parasitic capacitance generated in the bit line BL can be decreased. Therefore, the large fluctuation is not generated in the speed of the decrease in potential at the bit line BL during the erase operation.

I. Others

The two types of shunt areas, i.e., the shunt area for the source diffusion layer of the cell unit and the shunt area for both the source diffusion layer and cell well area of the cell unit exist in the layouts of the first to eighth examples. The configuration of the shunt area is not limited to the first to eighth examples.

For example, all the shunt areas may have contact portions with both the source diffusion layer and cell well area of the cell unit.

As shown in FIGS. 6, 9, and 11, contact portions with a source-side select gate line (SGS) and drain-side select gate line (SGD) are also provided in the shunt area in addition to the contact portions with both the source diffusion layer and cell well area of the cell unit.

Each two of cell source line drivers and cell well line drivers exist in the layouts of the first to eighth example. Alternatively, architecture in which only one cell source line driver and only one cell well line driver exist on the one chip may be adopted.

The cell source line driver includes a circuit which discharges the cell source line after the erase operation and a circuit which charges up the cell source line to the power supply potential Vdd during the erase verification and during generation of a write pulse.

The cell well line driver includes a circuit which discharges the cell well line after the erase operation.

(3) Summary

As described in the first to eighth example, an example of the invention can realize the layout of the power supply line of the nonvolatile semiconductor memory which can stably supply the power supply potential without enlarging the chip size.

3. APPLICATION EXAMPLES

Then, a specific layout in the case where an example of the invention is actually applied to a NAND flash memory will be described.

Figure 22:
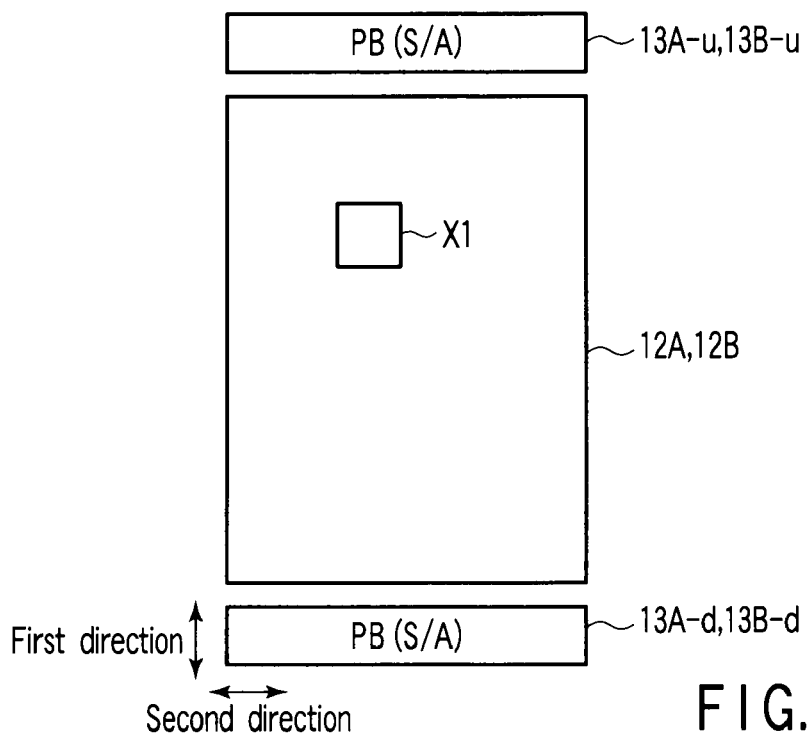
FIG. 22 shows layout according to an application example.

FIG. 22 shows a memory cell array of the NAND flash memory. FIGS. 23 to 29 show layout of the third metal layer M2 disposed on the memory cell array of FIG. 22.

Figure 23:
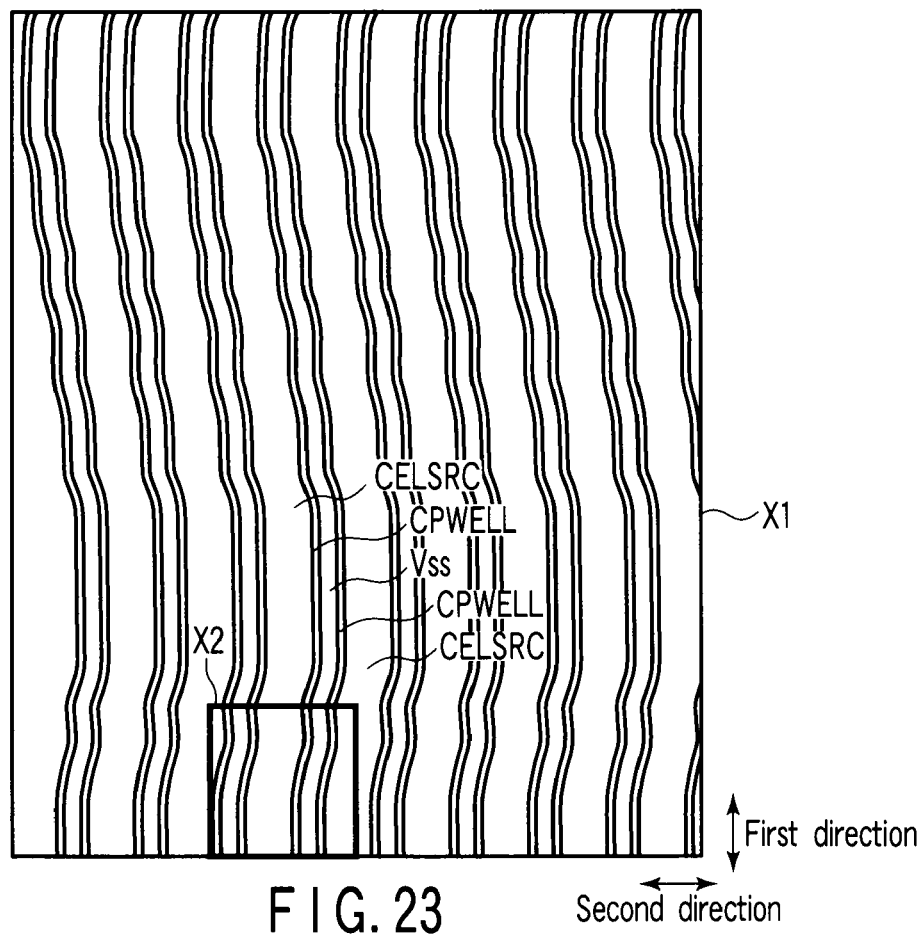
FIG. 23 is an enlarged view showing an area X1 of FIG. 22.

FIG. 23 is an enlarged view showing an area X1 of FIG. 22.

The conductive lines are laid out in the second direction in the order of the cell source line CELSRC→the cell well line CPWELL→the power supply line VSS→the cell well line CPWELL. The plural basic layouts are repeated in the second direction with the basic layout of the cell source line CELSRC→the cell well line CPWELL→the power supply line VSS→the cell well line CPWELL.

The cell well line CPWELL, the cell source line CELSRC, and the power supply line Vss have rippling shapes.

Figure 24:
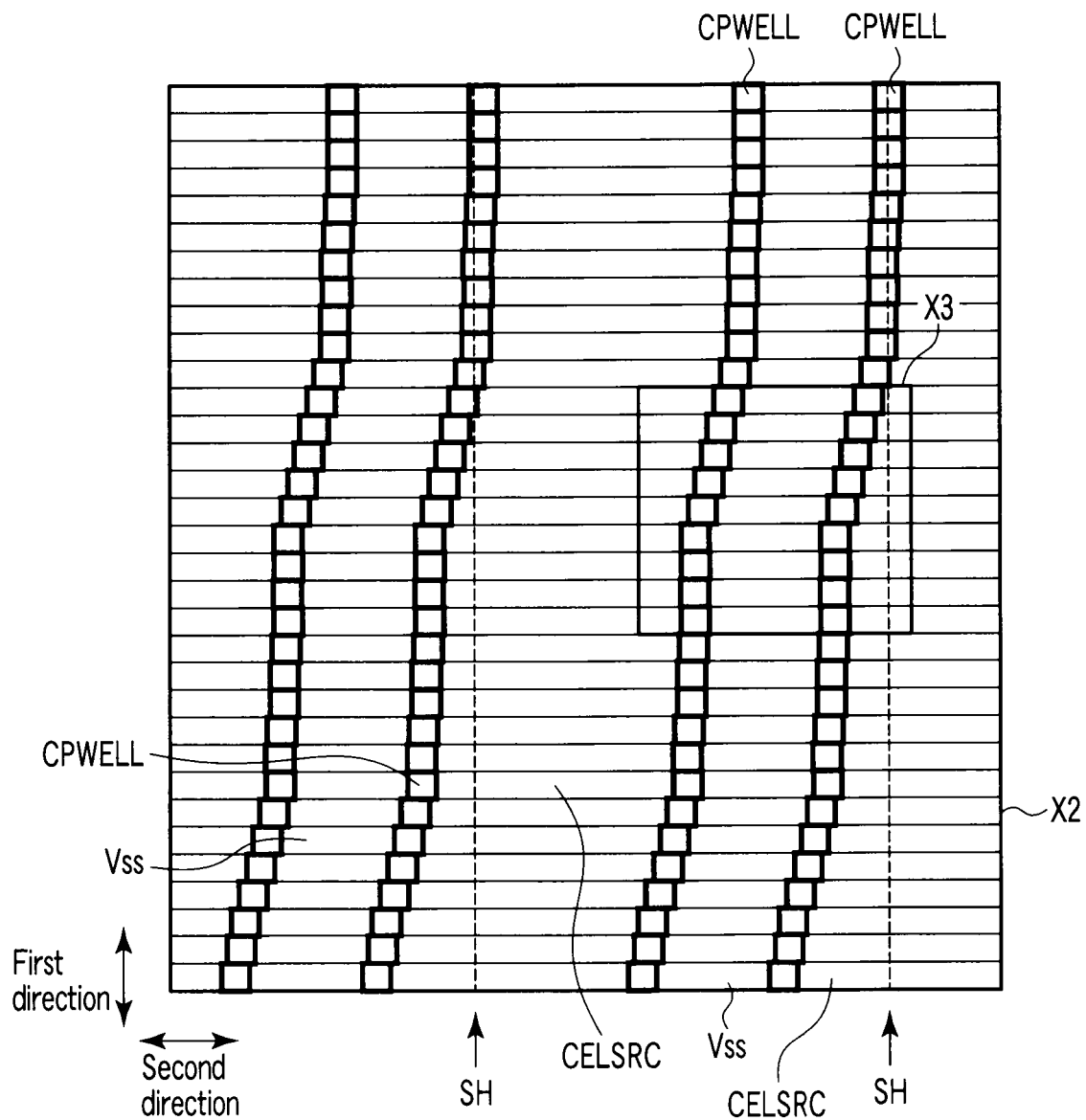
FIG. 24 is an enlarged view showing an area X2 of FIG. 23.
Figure 25:
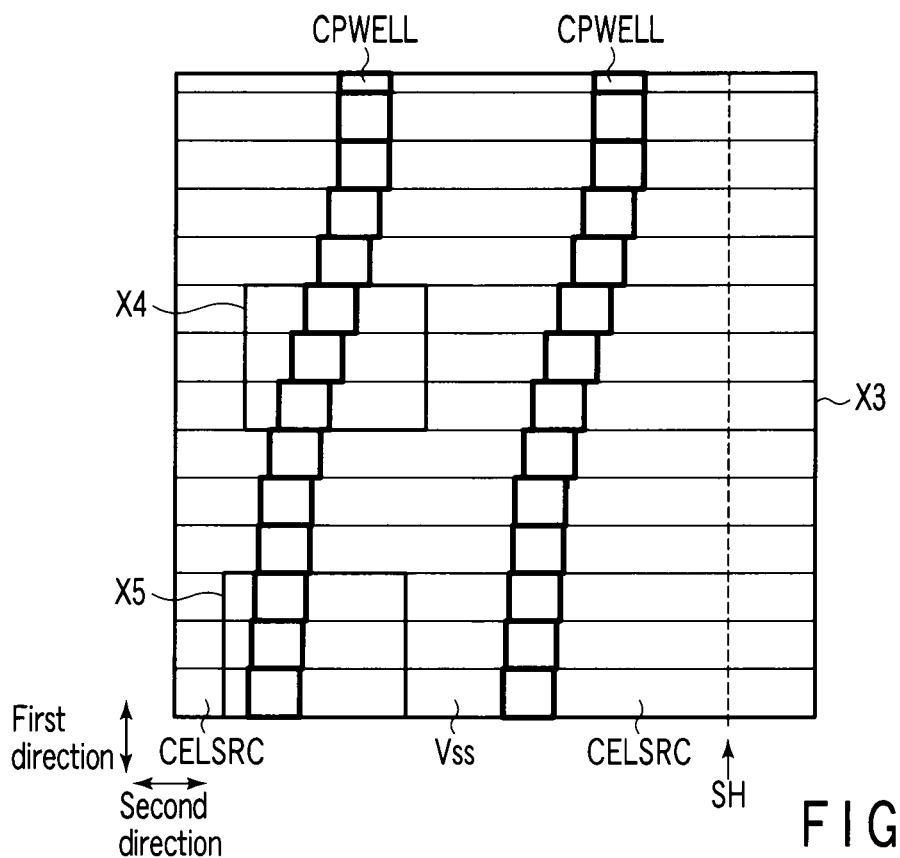
FIG. 25 is an enlarged view showing an area X3 of FIG. 24.

FIG. 24 is an enlarged view showing an area X2 of FIG. 23, and FIG. 25 is an enlarged view showing an area X3 of FIG. 24.

A longitudinally-extended dotted line indicates a shunt area SH. The shunt areas SH are disposed at predetermined intervals in the second direction. The shunt area SH overlaps the cell source line CELSRC and cell well line CPWELL.

A horizontally-extended solid line indicates a boundary of the NAND block.

Each of the cell well line CPWELL, the cell source line CELSRC, and the power supply line Vss has an area X4 extending in the first direction with a first inclination and an area X5 extended with a second inclination. The first inclination is larger than the second inclination.

Figure 26:
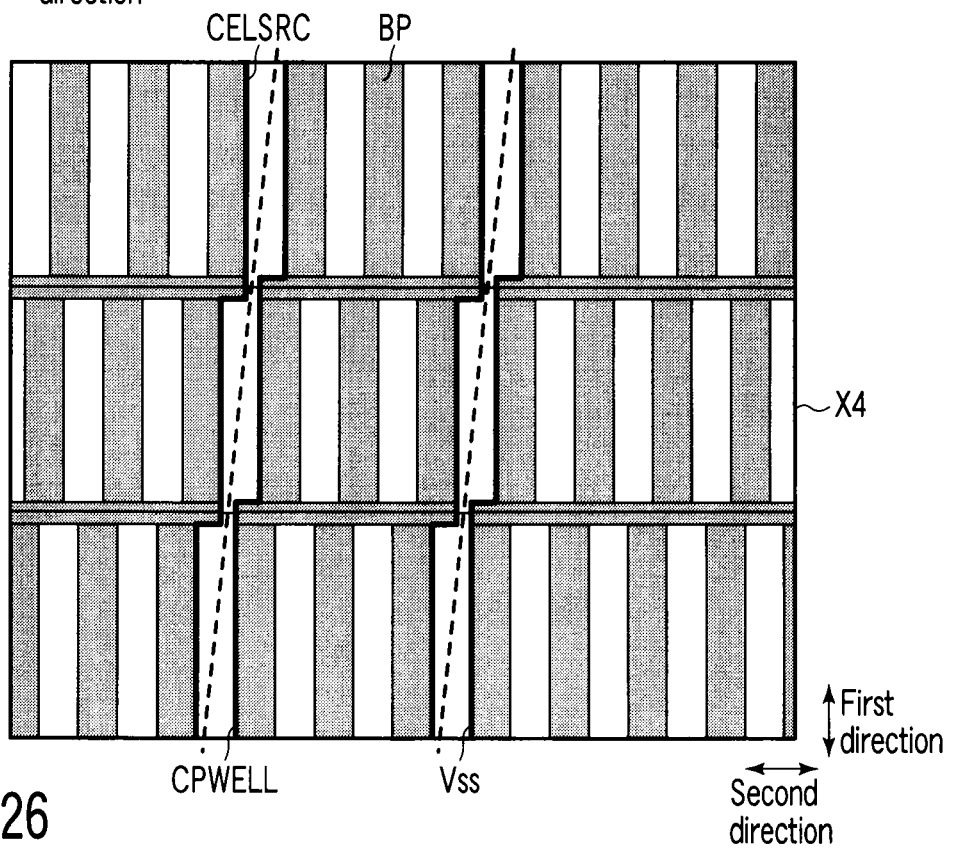
FIG. 26 is an enlarged view showing an area X4 of FIG. 25.
Figure 27:
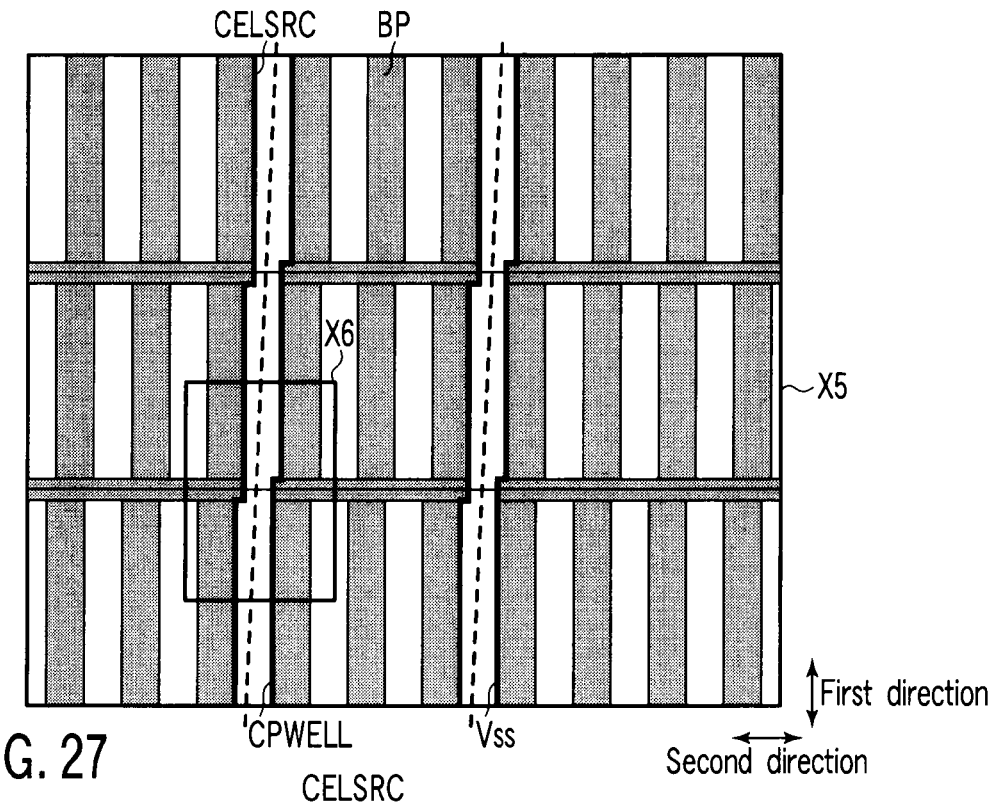
FIG. 27 is an enlarged view showing an area X5 of FIG. 25.

FIG. 26 is an enlarged view showing an area X4 of FIG. 25, and FIG. 27 is an enlarged view showing an area X5 of FIG. 25.

The cell well line CPWELL, the cell source line CELSRC, and the power supply line Vss are formed by the combination of the plural basic patterns BP respectively. A shaded point indicates the conductive line. An outline portion indicates a space. The size in the first direction of the basic pattern BP is the size in the first direction of the NAND block (NAND string), in other words, the size in the first direction of the basic pattern BP is the size with which the one cell unit is covered.

The size in the first direction of the basic pattern BP is not limited to the one NAND block, but the size in the first direction of the basic pattern BP may have a length corresponding to the plural NAND blocks.

In FIG. 26, the cell well line CPWELL, the cell source line CELSRC, and the power supply line Vss are extending in the first direction with the first inclination (shown by the dotted line). On the other hand, in FIG. 27, the cell well line CPWELL, the cell source line CELSRC, and the power supply line Vss are extending in the second direction with the second inclination (shown by the dotted line).

Thus, the inclinations of the cell well line CPWELL, cell source line CELSRC, and power supply line Vss can be controlled by adjusting the amount of shift in the second direction of the basic pattern BP.

Figure 28:
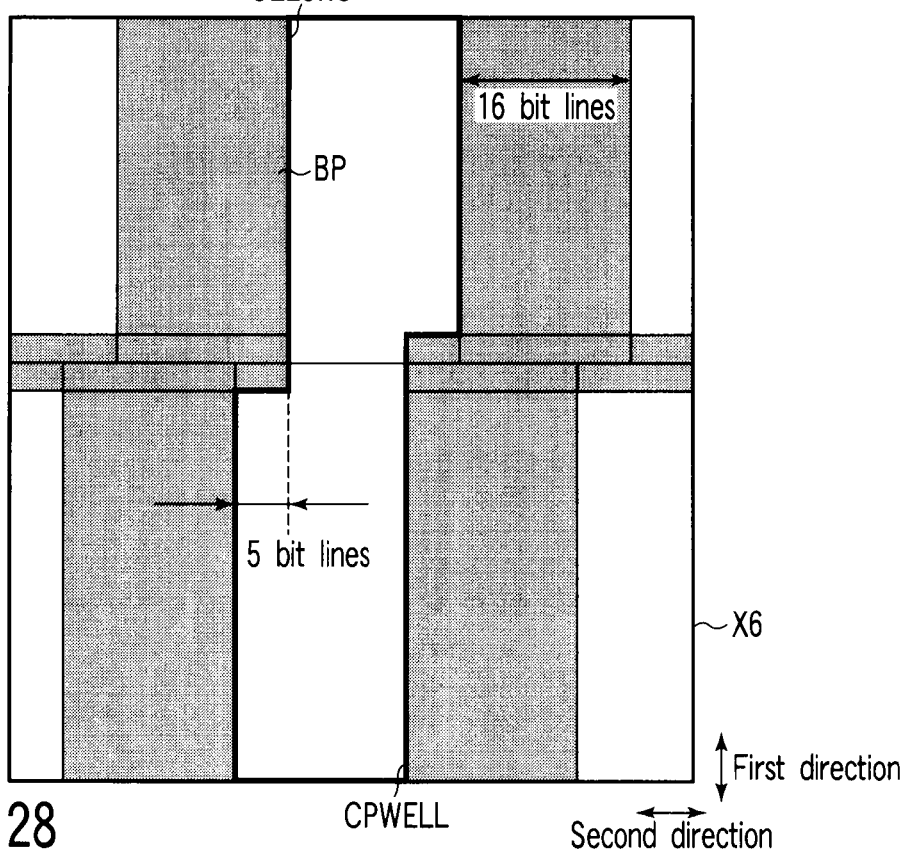
FIG. 28 is an enlarged view showing an area X6 of FIG. 26.

FIG. 28 is an enlarged view showing an area X6 of FIG. 27.

The size in the second direction of the basic pattern BP is the size in the second direction of the 16 bit lines. At this point, in FIG. 28, the layout is made so that the basic pattern BP is shifted in second direction by five bit lines when the basic pattern BP is shifted in the first direction by one NAND block.

Thus, the position of the metal layer M2 is changed little by little to uniform the coverage of the metal layer M2 to each bit line, which allows the coupling capacitance with the metal layer M2 to be uniformed with respect to each bit line.

Preferably the amount of shift is decreased as small as possible, and the amount of shift is not always formed in unit of five bit lines. Actually the bit line is increased or decreased during process, which easily influences the portion where the neighborhood of the boundary of the metal layer M2 is located on the bit line. Ideally, the influence of the change in width of the metal layer M2 during the process is desirably uniformed for all the bit lines such that the boundary of the metal layer M2 intersects each bit line by the same number of times. It is desirable that the influence of the fluctuation in the width of metal layer M is equal with respect to all bit lines at the time of manufacturing. In this case, although an absolute value of the capacitance of the bit line fluctuates slightly, a difference in capacitance generated in the bit line is hardly generated.

Figure 29:
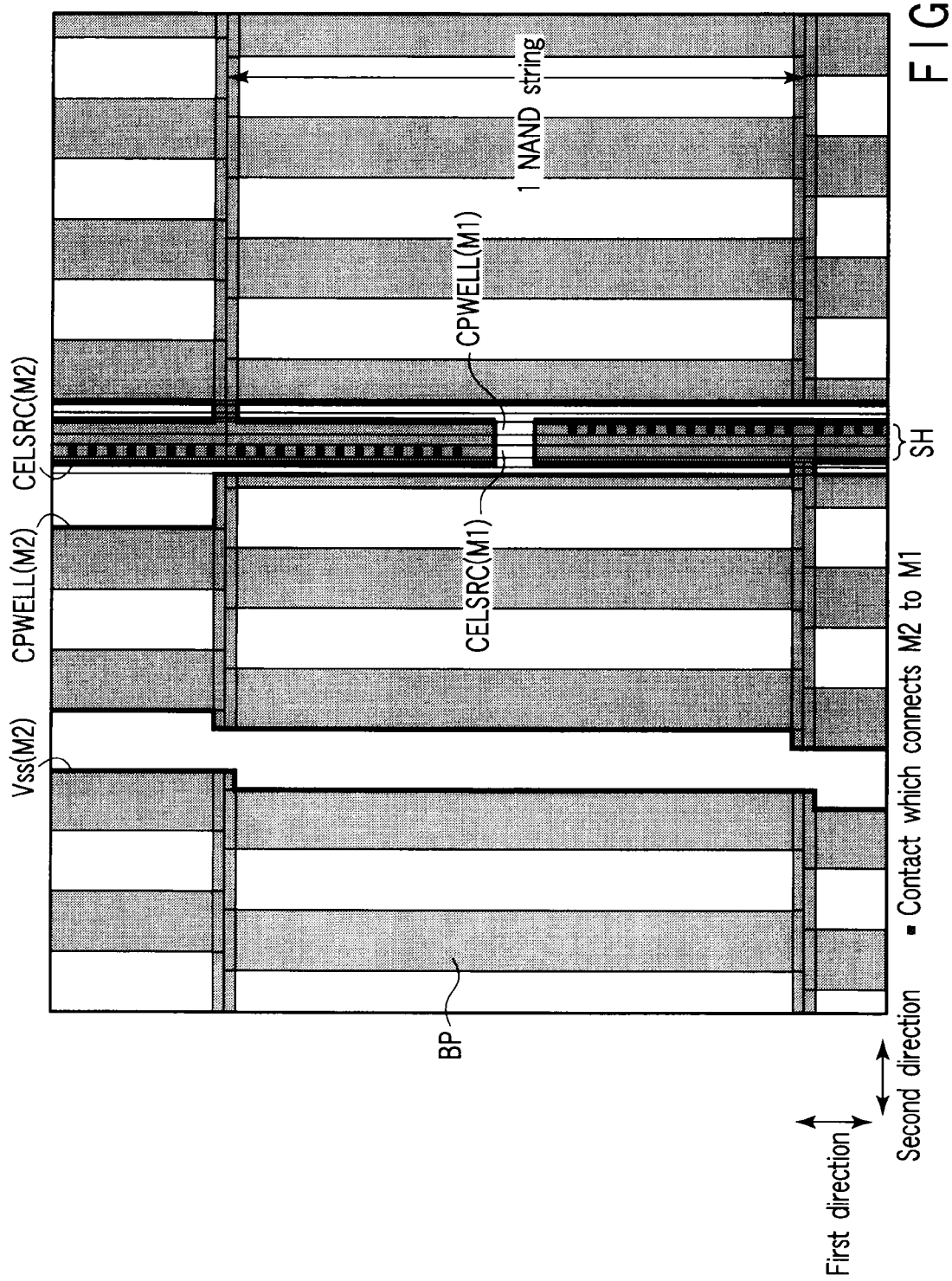
FIG. 29 is an enlarged view of a shunt area.

FIG. 29 is an enlarged view of the shunt area.

In the shunt area in the metal layer M1, the cell source line CELSRC and the cell well line CPWELL are arranged together while extending in first direction.

The cell source line CELSRC in the metal layer M2 is connected to the cell source line CELSRC in the metal layer M1 through the contact hole. The cell well line CPWELL in the metal layer M2 is connected to the cell well line CPWELL in the metal layer M1 through the contact hole.

FIG. 30 shows a method of changing the inclination of the direction in which the cell well line, cell source line, and power supply line are extended with respect to the first direction.

The basic patterns BP are regularly arranged, and the basic patterns BP are coupled to one another by conductive patterns XP extending in the second direction. The inclinations of the cell well line, cell source line, and power supply line can be controlled in a unit of a pitch P of the basic pattern BP by partially cutting the basic pattern BP and the conductive pattern XP as shown in areas Y1 and Y2.

The inclination becomes one NAND block/one pitch in FIG. 30(a), and the inclination becomes one NAND block/two pitches in FIG. 30(b).

Figure 31:
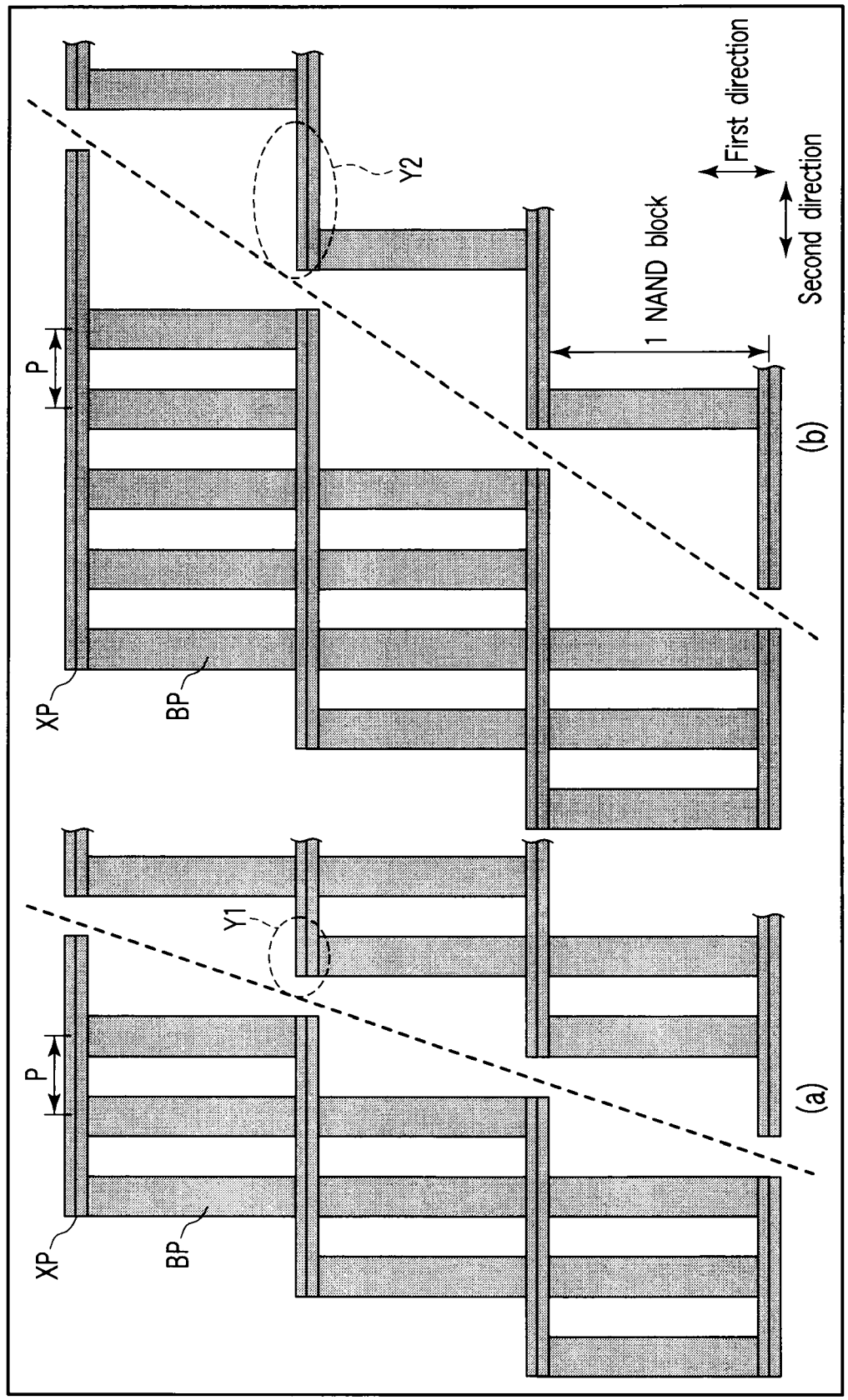
FIG. 31 shows a method of changing the inclination of the conductive line.

As shown in FIG. 31, a gap may be formed between the two conductive lines to partially remove the basic pattern BP.

An example of the invention can be applied not only to the NAND flash memory but also to general nonvolatile semiconductor memories. Additionally, an example of the invention can be applied to the floating gate memory cell whose charge accumulation layer is formed by a floating gate and a MONOS memory cell whose charge accumulation layer is formed by an insulating material such as nitride.

4. CONCLUSION

An example of the invention can realize the layout of the power supply line of the nonvolatile semiconductor memory which can stably supply the power supply potential without enlarging the chip size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory comprising:
a memory cell array which includes a plurality of cell units;
a power supply pad which is disposed on one end in a first direction of the memory cell array;
a first page buffer which is disposed on the other end in the first direction of the memory cell array;
a bit line which is disposed in a first layer on the memory cell array while extending in the first direction;
a non-power supply line which is disposed in a second layer on the first layer;
a power supply line which is disposed in the second layer to connect the power supply pad and the first page buffer, and the power supply line having a first portion above the memory cell array and a second portion in an area except above the memory cell array; and
a switching element which is connected to one end of the non-power supply line to set the non-power supply line in a floating state or a potential other than the power supply voltage,
wherein the non-power supply line and the first portion of the power supply line are adjacent to each other in a second direction orthogonal to the first direction, and extend in a meandering manner in the first direction,
wherein the bit line intersects to both of the non-power supply line and the first portion of the power supply line, when the bit line, the non-power supply line and the first portion of the power supply line are seen from a third direction orthogonal to the first and second direction.

2. The nonvolatile semiconductor memory according to claim 1, wherein the first portion of the power supply line is formed by a combination of a plurality of basic patterns, each of the plurality of basic patterns has a size in the first direction, at least one cell unit being covered with the size in the first direction, and each of the plurality of basic patterns has a size in the second direction, the bit line being covered with the size in the second direction.

3. The nonvolatile semiconductor memory according to claim 2, wherein each of the plurality of basic pattern has a network pattern.

4. The nonvolatile semiconductor memory according to claim 1, further comprising a second page buffer which is disposed on one end in the first direction of the memory cell array and between the power supply pad and the memory cell array,
wherein the first power supply line is also connected to the second page buffer.

5. The nonvolatile semiconductor memory according to claim 4, further comprising a peripheral circuit which is disposed on one end in the first direction of the memory cell array and between the power supply pad and the second page buffer.

6. The nonvolatile semiconductor memory according to claim 1, wherein each of the plurality of cell units includes a plurality of memory cells and two select gate transistors connected to both ends of the plurality of memory cells.

7. The nonvolatile semiconductor memory according to claim 6, wherein each of the plurality of memory cell is a floating gate memory cell.

8. The nonvolatile semiconductor memory according to claim 6, wherein each of the plurality of memory cell is a MONOS memory cell.

9. The nonvolatile semiconductor memory according to claim 1, wherein the power supply pad and the first power supply line are set to a ground potential.

10. The nonvolatile semiconductor memory according to claim 1, wherein the power supply pad and the first power supply line are set to a power supply potential.

11. The nonvolatile semiconductor memory according to claim 1, wherein the bit line intersects twice or more to both of the non-power supply line and the first portion of the power supply line.

12. The nonvolatile semiconductor memory according to claim 1, wherein the bit line intersects in an angle smaller than 90 degrees to both of the non-power supply line and the first portion of the power supply line or to both of the chunk of basic patterns of the non-power supply line and the first portion of the power supply line.

13. The nonvolatile semiconductor memory according to claim 1, wherein the switching element is set to an off-state to set the non-power supply line in the floating state or to set an erase voltage, in an erase operation.

14. The nonvolatile semiconductor memory according to claim 1, wherein the second portion of the power supply line has a pattern surrounding the memory cell array.

15. The nonvolatile semiconductor memory according to claim 1, wherein the non-power supply line is a cell source line which is connected to a source terminal of the plurality of cell units.

16. The nonvolatile semiconductor memory according to claim 15, wherein the switching element is connected between one end of the non-power supply line and the second portion of the power supply line.

17. The nonvolatile semiconductor memory according to claim 15, wherein the cell source line which is disposed in the second layer is connected to the source terminal through a shunt area of the memory cell array.

18. The nonvolatile semiconductor memory according to claim 1, wherein the non-power supply line is a cell well line which is connected to a well area in which the plurality of cell units are disposed.

19. The nonvolatile semiconductor memory according to claim 18, wherein the switching element is connected between one end of the non-power supply line and the second portion of the power supply line.

20. The nonvolatile semiconductor memory according to claim 18, wherein the cell well line is connected to the well area in a shunt area of the memory cell array.

* * * * *